(12) United States Patent
More et al.

(10) Patent No.: US 12,142,683 B2
(45) Date of Patent: Nov. 12, 2024

(54) METHOD OF MANUFACTURING A SEMICONDUCTOR DEVICE AND A SEMICONDUCTOR DEVICE

(71) Applicant: TAIWAN SEMICONDUCTOR MANUFACTURING COMPANY, LTD., Hsinchu (TW)

(72) Inventors: Shahaji B. More, Hsinchu (TW); Shih-Chieh Chang, Taipei (TW); Cheng-Han Lee, New Taipei (TW); Pei-Shan Lee, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 153 days.

(21) Appl. No.: 17/875,246

(22) Filed: Jul. 27, 2022

(65) Prior Publication Data
US 2022/0367706 A1 Nov. 17, 2022

Related U.S. Application Data

(62) Division of application No. 16/984,075, filed on Aug. 3, 2020, now Pat. No. 11,444,199.

(51) Int. Cl.
*H01L 29/78* (2006.01)
*H01L 21/8234* (2006.01)
(Continued)

(52) U.S. Cl.
CPC .... *H01L 29/785* (2013.01); *H01L 21/823418* (2013.01); *H01L 29/41791* (2013.01);
(Continued)

(58) Field of Classification Search
CPC .......... H01L 29/785; H01L 21/823418; H01L 29/41791; H01L 29/42392;
(Continued)

(56) References Cited

U.S. PATENT DOCUMENTS

| 8,610,175 B2 | 12/2013 | Hong et al. |
| 9,209,247 B2 | 12/2015 | Colinge et al. |

(Continued)

FOREIGN PATENT DOCUMENTS

| CN | 102931083 A | 2/2013 |
| CN | 103779216 A | 5/2014 |

(Continued)

*Primary Examiner* — Farun Lu
(74) *Attorney, Agent, or Firm* — STUDEBAKER & BRACKETT PC

(57) ABSTRACT

A semiconductor device includes semiconductor wires or sheets disposed over a substrate, a source/drain epitaxial layer in contact with the semiconductor wires or sheets, a gate dielectric layer disposed on and wrapping around each channel region of the semiconductor wires or sheets, a gate electrode layer disposed on the gate dielectric layer and wrapping around each channel region, and insulating spacers disposed in spaces, respectively. The spaces are defined by adjacent semiconductor wires or sheets, the gate electrode layer and the source/drain region. The source/drain epitaxial layer includes multiple doped SiGe layers having different Ge contents and at least one of the source/drain epitaxial layers is non-doped SiGe or Si.

20 Claims, 14 Drawing Sheets

(51) Int. Cl.
*H01L 29/417* (2006.01)
*H01L 29/423* (2006.01)
*H01L 29/66* (2006.01)
*H01L 29/786* (2006.01)

(52) U.S. Cl.
CPC .. *H01L 29/42392* (2013.01); *H01L 29/66795* (2013.01); *H01L 29/78687* (2013.01); *H01L 2029/7858* (2013.01)

(58) Field of Classification Search
CPC ......... H01L 29/66795; H01L 29/78687; H01L 2029/7858; H01L 29/66469; H01L 21/823814; H01L 21/823842; H01L 27/092; H01L 29/045; H01L 29/0673; H01L 29/0847; H01L 29/161; H01L 29/165; H01L 29/66439; H01L 29/66545; H01L 29/775; H01L 29/7848; H01L 29/78696; H01L 21/823807; B82Y 10/00
See application file for complete search history.

(56) References Cited

U.S. PATENT DOCUMENTS

| | | | |
|---|---|---|---|
| 9,236,267 | B2 | 1/2016 | De et al. |
| 9,412,817 | B2 | 8/2016 | Yang et al. |
| 9,412,828 | B2 | 8/2016 | Ching et al. |
| 9,472,618 | B2 | 10/2016 | Oxland |
| 9,502,265 | B1 | 11/2016 | Jiang et al. |
| 9,520,482 | B1 | 12/2016 | Chang et al. |
| 9,536,738 | B2 | 1/2017 | Huang et al. |
| 9,576,814 | B2 | 2/2017 | Wu et al. |
| 9,608,116 | B2 | 3/2017 | Ching et al. |
| 9,831,251 | B2 | 11/2017 | Huang et al. |
| 10,644,154 | B2 | 5/2020 | Ching et al. |
| 11,489,074 | B2 | 11/2022 | Li et al. |
| 2005/0023552 | A1 | 2/2005 | Chang et al. |
| 2007/0254414 | A1* | 11/2007 | Miyanami ........... H01L 29/7848 257/E29.267 |
| 2011/0049643 | A1* | 3/2011 | Matsuoka ........... H01L 29/7834 438/231 |
| 2014/0377936 | A1 | 12/2014 | Lee et al. |
| 2016/0013189 | A1 | 1/2016 | Cheng et al. |
| 2016/0225852 | A1 | 8/2016 | Ray et al. |
| 2018/0006118 | A1 | 1/2018 | Mallela et al. |
| 2018/0175195 | A1 | 6/2018 | Huang |
| 2018/0366375 | A1 | 12/2018 | Chen et al. |
| 2019/0067441 | A1* | 2/2019 | Yang .................. H01L 29/4908 |
| 2020/0395446 | A1* | 12/2020 | Yi ....................... H01L 29/0673 |
| 2021/0028281 | A1* | 1/2021 | Kim .................. H01L 29/66795 |

FOREIGN PATENT DOCUMENTS

| | | |
|---|---|---|
| CN | 105742284 A | 7/2016 |
| CN | 106057672 A | 10/2016 |
| CN | 106469653 A | 3/2017 |

* cited by examiner

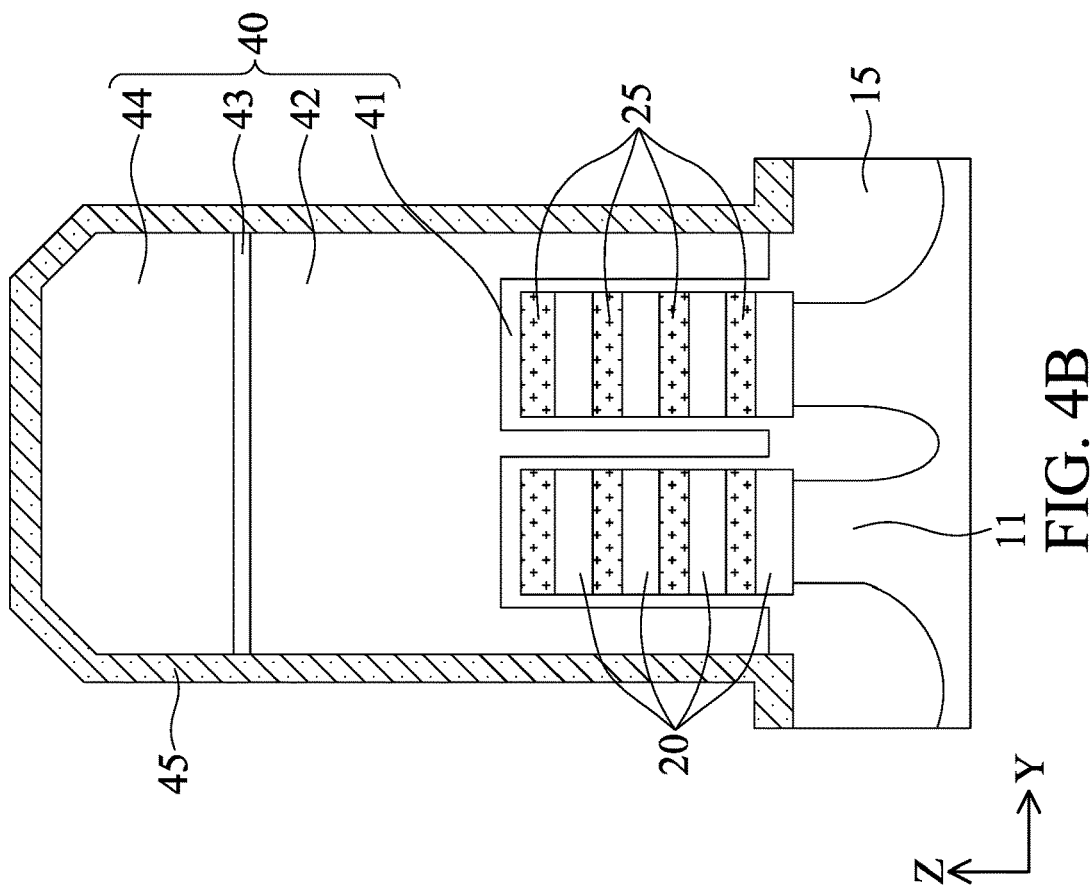
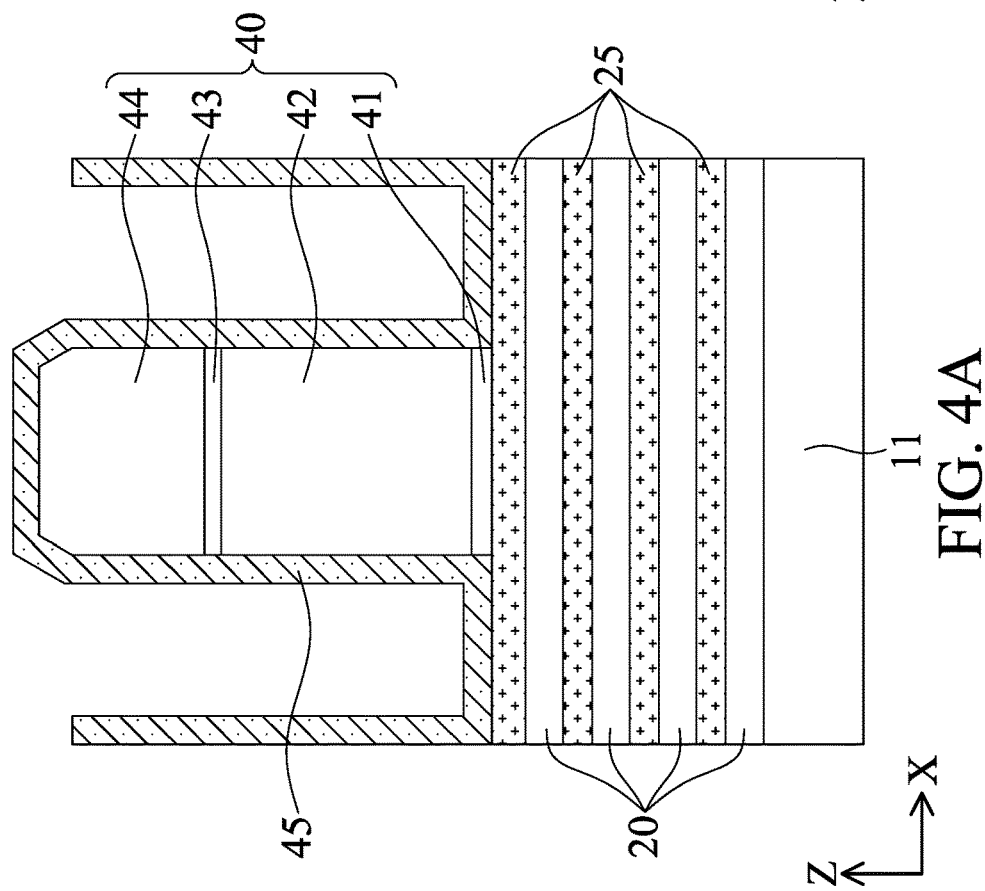
FIG. 4A
FIG. 4B ized. In addition, the term "made of" may mean either "comprising" or "consisting of." Further, in the following fabrication process, there may be one or more additional operations in/between the described operations, and the order of operations may be changed.

METHOD OF MANUFACTURING A SEMICONDUCTOR DEVICE AND A SEMICONDUCTOR DEVICE

RELATED APPLICATIONS

This application is a divisional of U.S. patent application Ser. No. 16/984,075 filed Aug. 3, 2020, now U.S. Pat. No. 11,444,199, the entire content of which is incorporated herein by reference.

BACKGROUND

As the semiconductor industry has progressed into nanometer technology process nodes in pursuit of higher device density, higher performance, and lower costs, challenges from both fabrication and design issues have resulted in the development of three-dimensional designs, such as a multigate field effect transistor (FET), including a fin FET (Fin FET) and a gate-all-around (GAA) FET. In a Fin FET, a gate electrode is adjacent to three side surfaces of a channel region with a gate dielectric layer interposed therebetween. Because the gate structure surrounds (wraps) the fin on three surfaces, the transistor essentially has three gates controlling the current through the fin or channel region. Unfortunately, the fourth side, the bottom part of the channel is far away from the gate electrode and thus is not under close gate control. In contrast, in a GAA FET, all side surfaces of the channel region are surrounded by the gate electrode, which allows for fuller depletion in the channel region and results in less short-channel effects due to steeper sub-threshold current swing (SS) and smaller drain induced barrier lowering (DIBL). As transistor dimensions are continually scaled down to sub 10-15 nm technology nodes, further improvements of the GAA FET are required.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIG. 1A is a cross sectional view along the X direction (source-drain direction), FIG. 1B is a cross sectional view corresponding to Y1-Y1 of FIG. 1A, FIG. 1C is a cross sectional view corresponding to Y2-Y2 of FIG. 1A and FIG. 1D shows a cross sectional view corresponding to Y3-Y3 of FIG. 1A

FIGS. 4A and 4B show one of the various stages of manufacturing a semiconductor GAA FET device according to an embodiment of the present disclosure.

DETAILED DESCRIPTION

Figures 1A, 1B, 1C, 1D:
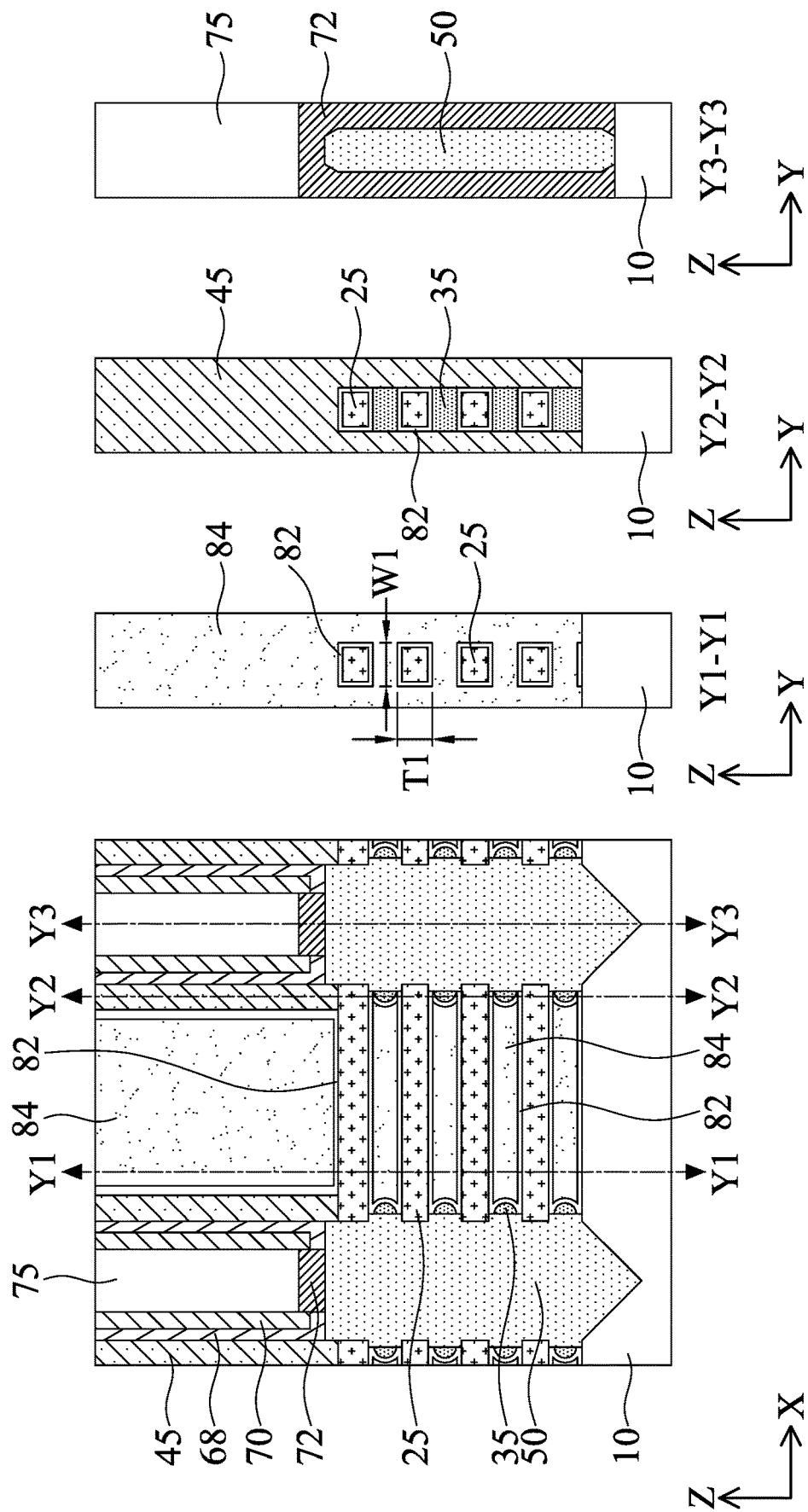
FIGS. 1A-1D show various views of a semiconductor FET device according to an embodiment of the present disclosure.

It is to be understood that the following disclosure provides many different embodiments, or examples, for implementing different features of the invention. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. In addition, the term "being made of" may mean either "comprising" or "consisting of." In the present disclosure, a phrase "one of A, B and C" means "A, B and/or C" (A, B, C, A and B, A and C, B and C, or A, B and C), and does not mean one element from A, one element from B and one element from C, unless otherwise described.

Generally, it is difficult to control lateral etching amounts when the nanowires (NWs) are released by selectively etching sacrificial semiconductor layers. The lateral ends of the NWs may be etched when the NW release etching process is performed after a dummy polysilicon gate is removed, because a lateral etching control or an etching budget for the NW release etch is not sufficient. A gate electrode may touch a source/drain (source/drain) epitaxial layer if there is no etch stop layer. Further, there is a larger impact on gate to drain capacitance (Cgd). If no dielectric film existed between the gate and the source/drain region, Cgd becomes larger, which would reduce circuit speed. Further, in a FinFET or a GAA FET, a source/drain (source/drain) epitaxial layer is required to be defect free. In the present disclosure, a novel method for fabricating a source/drain (source and/or drain) epitaxial layer for a GAA FET and a stacked channel FET are provided. In this disclosure, a source/drain refers to a source and/or a drain. It is noted that in the present disclosure, a source and a drain are interchangeably used and the structures thereof are substantially the same.

FIGS. 1A-1D show various views of a semiconductor GAA FET device according to an embodiment of the present disclosure. FIG. 1A is a cross sectional view along the X direction (source-drain direction), FIG. 1B is a cross sectional view corresponding to Y1-Y1 of FIG. 1A, FIG. 1C is a cross sectional view corresponding to Y2-Y2 of FIG. 1A and FIG. 1D shows a cross sectional view corresponding to Y3-Y3 of FIG. 1A. In some embodiments, the semiconductor GAA FET device of FIGS. 1A-1D is a p-type FET.

As shown in FIGS. 1A-1C, semiconductor wires or sheets 25 are provided over a semiconductor substrate 10, and vertically arranged along the Z direction (the normal direction to the principal surface of the substrate 10). In some embodiments, the substrate 10 includes a single crystalline semiconductor layer on at least its surface portion. The substrate 10 may comprise a single crystalline semiconductor material such as, but not limited to Si, Ge, SiGe, GaAs, InSb, GaP, GaSb, InAlAs, InGaAs, GaSbP, GaAsSb and InP. In certain embodiments, the substrate 10 is made of crystalline Si.

The substrate 10 may include in its surface region, one or more buffer layers (not shown). The buffer layers can serve to gradually change the lattice constant from that of the substrate to that of the source/drain regions. The buffer layers may be formed from epitaxially grown single crystalline semiconductor materials such as, but not limited to Si, Ge, GeSn, SiGe, GaAs, InSb, GaP, GaSb, InAlAs, InGaAs, GaSbP, GaAsSb, GaN, GaP, and InP. In a particular embodiment, the substrate 10 comprises silicon germanium (SiGe) buffer layers epitaxially grown on the silicon substrate 10. The germanium concentration of the SiGe buffer layers may increase from 30 atomic % germanium for the bottom-most buffer layer to 70 atomic % germanium for the top-most buffer layer.

As shown in FIGS. 1A-1C, the semiconductor wires or sheets 25, which are channel layers, are disposed over the substrate 10. In some embodiments, the semiconductor wires 25 are disposed over a fin structure 11 (see, FIG. 3) protruding from the substrate 10. Each of the channel layers 25 is wrapped around by a gate dielectric layer 82 and a gate electrode layer 84. The thickness T1 of the semiconductor wires 25 is in a range from about 5 nm to about 60 nm and the width W1 of the semiconductor wires 25 is in a range from about 5 nm to about 120 nm in some embodiments. In some embodiments, the width of the semiconductor wires or sheets is greater than the thickness. In certain embodiments, the width is up to twice or five times the thickness of the semiconductor wires or sheets 25.

In some embodiments, an interfacial dielectric layer is formed between the channel of the semiconductor wire 25 and the gate dielectric layer 82. In some embodiments, the gate dielectric layer 82 includes a high-k dielectric layer. The gate structure includes the gate dielectric layer 82, the gate electrode layer 84 and sidewall spacers 40. Although FIGS. 1A-1C show four semiconductor wires 25, the number of the semiconductor wires 25 is not limited to four, and may be as small as one or more than four, and may be up to ten. By adjusting the number of the semiconductor wires, a driving current of the GAA FET device can be adjusted.

Further, a source/drain epitaxial layer 50 is disposed over the substrate 10. The source/drain epitaxial layer 50 is in direct contact with end faces of the channel layer 25, and is separated by insulating inner spacers 35 and the gate dielectric layer 82 from the gate electrode layer 84. In some embodiments, an additional insulating layer (not shown) is conformally formed on the inner surface of the spacer regions. As shown FIG. 1A, the cross section along the X direction of the inner spacer 35 has a rounded shape (e.g., semi-circular or U-shape) convex toward the gate electrode.

An interlayer dielectric (ILD) layer 70 is disposed over the source/drain epitaxial layer 50 and a conductive contact layer 72 is disposed on the source/drain epitaxial layer 50, and a conductive plug 75 passing though the ILD layer 70 is disposed over the conductive contact layer 72. The conductive contact layer 72 includes one or more layers of conductive material. In some embodiments, the conductive contact layer 72 includes a silicide layer, such as WSi, NiSi, TiSi or CoSi or other suitable silicide material or an alloy of a metal element and silicon and/or germanium. In some embodiments, an etch stop layer 68 is disposed between the sidewall spacers 45 and the ILD layer 70 and on a part of the upper surface of the epitaxial layer 50.

In some embodiments, the FET shown in FIGS. 1A-1D is a p-type FET. The source/drain epitaxial layer 50 includes one or more layers of Si, SiGe, Ge, SiGeSn, SiSn and GeSnP. In some embodiments, the source/drain epitaxial layer 50 further includes boron (B).

FIGS. 2 to 14 show various stages of manufacturing a semiconductor FET device according to an embodiment of the present disclosure. It is understood that additional operations can be provided before, during, and after processes shown by FIGS. 2-14, and some of the operations described below can be replaced or eliminated, for additional embodiments of the method. The order of the operations/processes may be interchangeable. Material, configuration, dimensions and/or processes the same as or similar to the foregoing embodiments described with respect to FIGS. 1A-1D may be employed in the embodiment of FIGS. 2-14, and detailed explanation thereof may be omitted.

Figure 2:
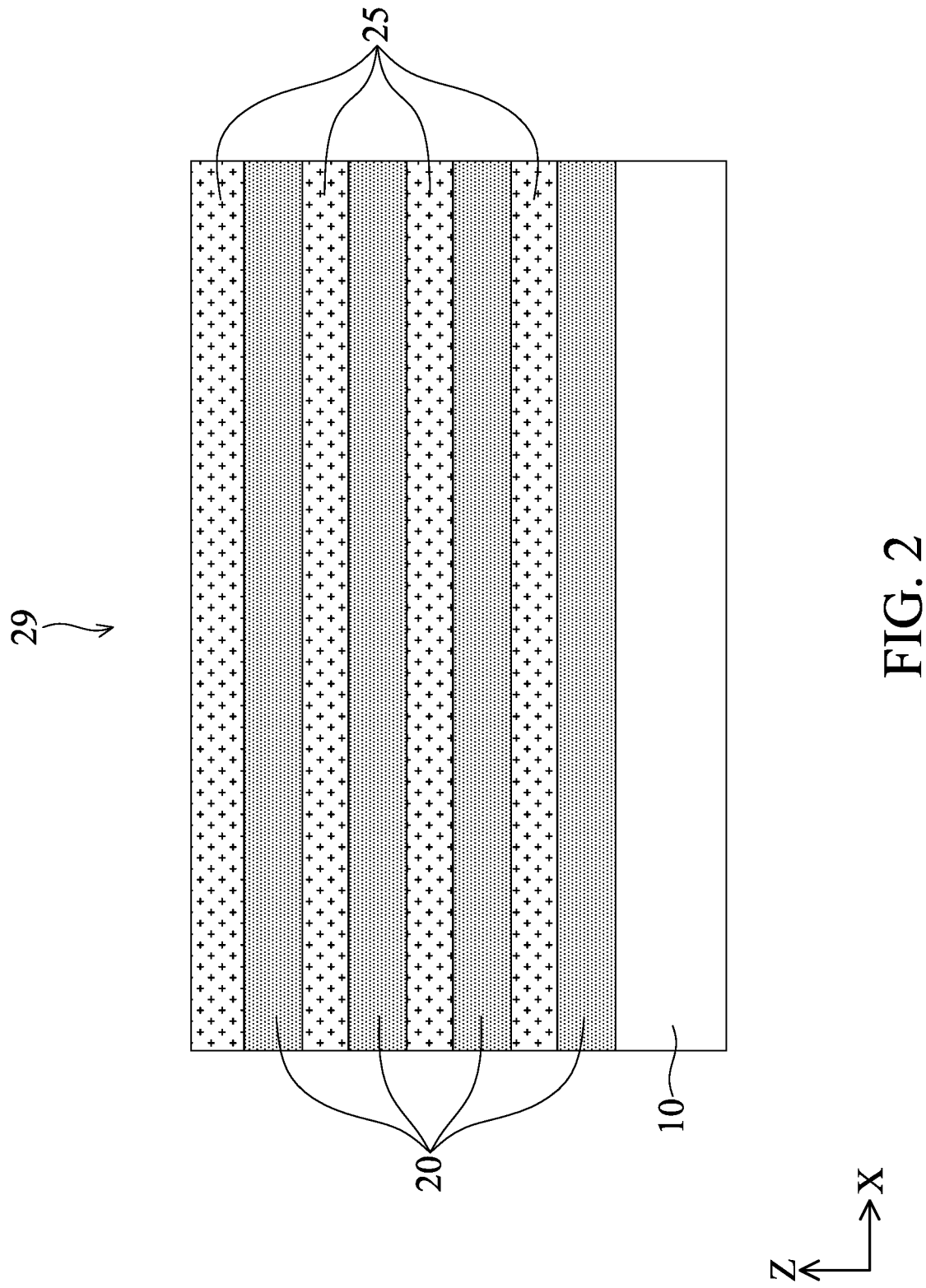
FIG. 2 shows one of the various stages of manufacturing a semiconductor GAA FET device according to an embodiment of the present disclosure.

As shown in FIG. 2, first semiconductor layers 20 and second semiconductor layers 25 are alternately formed over the substrate 10. The first semiconductor layers 20 and the second semiconductor layers 25 are made of materials having different lattice constants, and may include one or more layers of Si, Ge, SiGe, GaAs, InSb, GaP, GaSb, InAlAs, InGaAs, GaSbP, GaAs Sb or InP.

In some embodiments, the first semiconductor layers 20 and the second semiconductor layers 25 are made of Si, a Si compound, SiGe, Ge or a Ge compound. In one embodiment, the first semiconductor layers 20 are $Si_{1-x}Ge_x$, where x is equal to or more than about 0.1 and equal to or less than about 0.6, and the second semiconductor layers 25 are Si or $Si_{1-y}Ge_y$, where y is smaller than x and equal to or less than about 0.2. In this disclosure, an "M" compound" or an "M based compound" means the majority of the compound is M.

The first semiconductor layers 20 and the second semiconductor layers 25 are epitaxially formed over the substrate 10. The thickness of the first semiconductor layers 20 may be equal to or greater than that of the second semiconductor layers 25, and is in a range from about 5 nm to about 60 nm in some embodiments, and is in a range from about 10 nm to about 30 nm in other embodiments. The thickness of the second semiconductor layers 25 is in a range from about 5 nm to about 60 nm in some embodiments, and is in a range from about 10 nm to about 30 nm in other embodiments. The thickness of the first semiconductor layers 20 may be the same as, or different from the thickness of the second semiconductor layers 25. Although four first semiconductor layers 20 and four second semiconductor layers 25 are shown in FIG. 2, the numbers are not limited to four, and can be 1, 2, 3 or more than 4, and is less than 20. In some embodiments, the number of the first semiconductor layers 20 is greater by one than the number of the second semiconductor layers 25 (the top layer is the first semiconductor layer).

Figure 3:
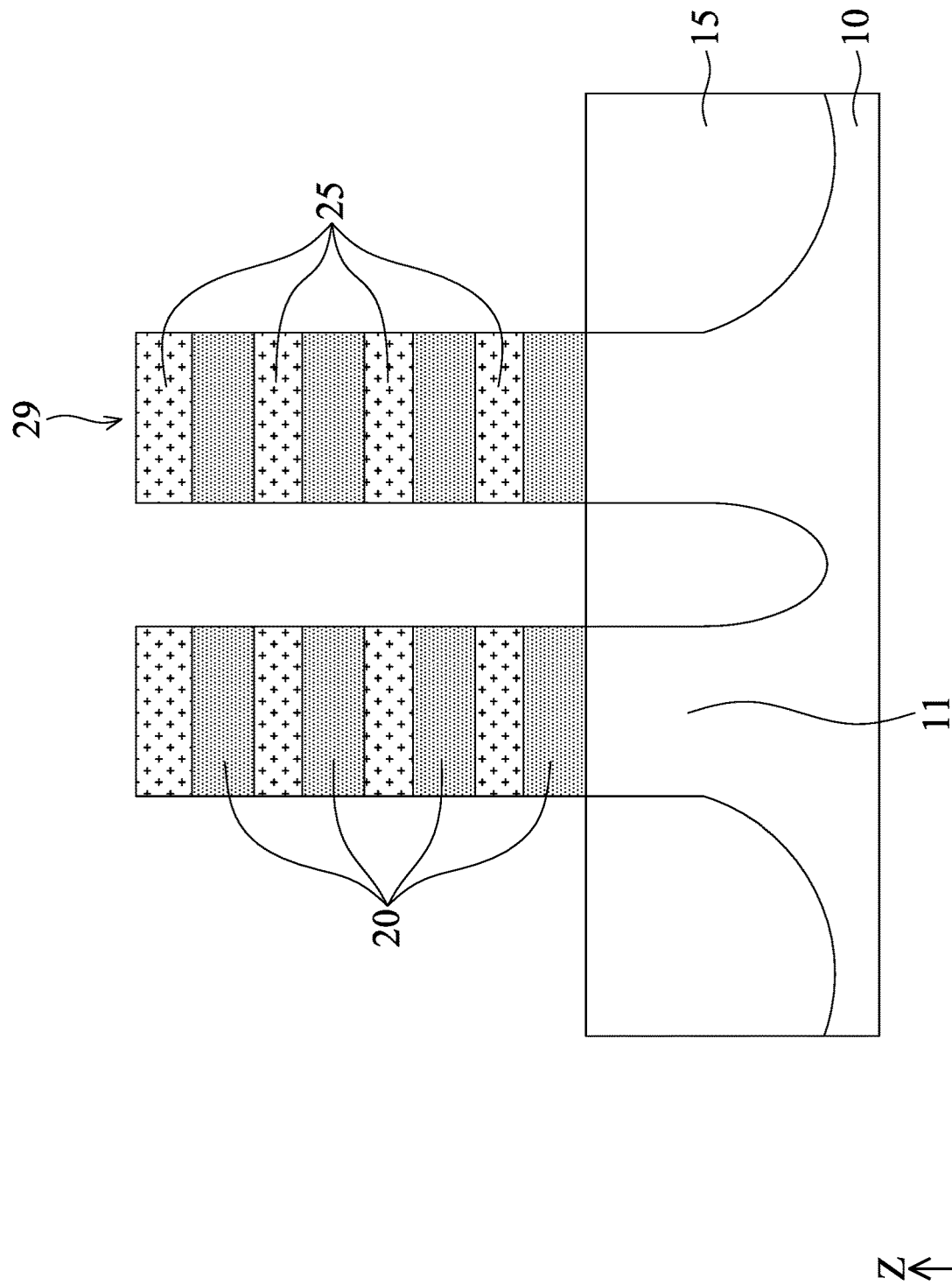
FIG. 3 shows one of the various stages of manufacturing a semiconductor GAA FET device according to an embodiment of the present disclosure.

After the stacked semiconductor layers are formed, fin structures are formed by using one or more lithography and etching operations, as shown in FIG. 3. The fin structures may be patterned by any suitable method. For example, the fin structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fin structures.

As shown in FIG. 3, the fin structures 29 extend in the X direction and are arranged in the Y direction. The number of the fin structures is not limited to two as shown in FIG. 3, and may be as small as one and three or more. In some embodiments, one or more dummy fin structures are formed on both sides of the fin structures 29 to improve pattern fidelity in the patterning operations. As shown in FIG. 3, the fin structures 29 have upper portions constituted by the stacked semiconductor layers 20, 25 and well portions 11.

The width of the upper portion of the fin structure 29 along the Y direction is in a range from about 10 nm to about 40 nm in some embodiments, and is in a range from about 20 nm to about 30 nm in other embodiments.

After the fin structures 29 are formed, an insulating material layer including one or more layers of insulating material is formed over the substrate so that the fin structures are fully embedded in the insulating layer. The insulating material for the insulating layer may include silicon oxide, silicon nitride, silicon oxynitride (SiON), SiOCN, SiCN, fluorine-doped silicate glass (FSG), or a low-k dielectric material, formed by LPCVD (low pressure chemical vapor deposition), plasma-enhanced CVD (PECVD) or flowable CVD. An anneal operation may be performed after the formation of the insulating layer. Then, a planarization operation, such as a chemical mechanical polishing (CMP) method and/or an etch-back method, is performed such that the upper surface of the uppermost second semiconductor layer 25 is exposed from the insulating material layer. In some embodiments, one or more fin liner layers are formed over the fin structures before forming the insulating material layer. In some embodiments, the fin liner layers include a first fin liner layer formed over the substrate 10 and sidewalls of the bottom part of the fin structures 11, and a second fin liner layer formed on the first fin liner layer. The fin liner layers are made of silicon nitride or a silicon nitride-based material (e.g., SiON, SiCN or SiOCN). The fin liner layers may be deposited through one or more processes such as physical vapor deposition (PVD), chemical vapor deposition (CVD), or atomic layer deposition (ALD), although any acceptable process may be utilized.

Then, as shown in FIG. 3, the insulating material layer is recessed to form an isolation insulating layer 15 so that the upper portions of the fin structures 29 are exposed. With this operation, the fin structures 29 are separated from each other by the isolation insulating layer 15, which is also called a shallow trench isolation (STI). The isolation insulating layer 15 may be made of suitable dielectric materials such as silicon oxide, silicon nitride, silicon oxynitride, fluorine-doped silicate glass (FSG), low-k dielectrics such as carbon doped oxides, extremely low-k dielectrics such as porous carbon doped silicon dioxide, a polymer such as polyimide, combinations of these, or the like. In some embodiments, the isolation insulating layer 15 is formed through a process such as CVD, flowable CVD (FCVD), or a spin-on-glass process, although any acceptable process may be utilized.

In some embodiments, the insulating material layer 15 is recessed until the upper portion of the fin structure (well layer) 11 is exposed. In other embodiments, the upper portion of the fin structure 11 is not exposed. The first semiconductor layers 20 are sacrificial layers which are subsequently partially removed, and the second semiconductor layers 25 are subsequently formed into semiconductor wires as channel layers of a p-type GAA FET. In other embodiments, the second semiconductor layers 25 are sacrificial layers which are subsequently partially removed, and the first semiconductor layers 20 are subsequently formed into semiconductor wires as channel layers.

After the isolation insulating layer 15 is formed, a sacrificial (dummy) gate structure 40 is formed, as shown in FIGS. 4A and 4B. FIGS. 4A and 4B illustrate a structure after a sacrificial gate structure 40 is formed over the exposed fin structures 29. The sacrificial gate structure 40 is formed over a portion of the fin structures which is to be a channel region. The sacrificial gate structure 40 defines the channel region of the GAA FET. The sacrificial gate structure 40 includes a sacrificial gate dielectric layer 41 and a sacrificial gate electrode layer 42. The sacrificial gate dielectric layer 41 includes one or more layers of insulating material, such as a silicon oxide-based material. In one embodiment, silicon oxide formed by CVD is used. The thickness of the sacrificial gate dielectric layer 41 is in a range from about 1 nm to about 5 nm in some embodiments.

The sacrificial gate structure 40 is formed by first blanket depositing the sacrificial gate dielectric layer 41 over the fin structures. A sacrificial gate electrode layer is then blanket deposited on the sacrificial gate dielectric layer and over the fin structures, such that the fin structures are fully embedded in the sacrificial gate electrode layer. The sacrificial gate electrode layer includes silicon such as polycrystalline silicon or amorphous silicon. The thickness of the sacrificial gate electrode layer is in a range from about 100 nm to about 200 nm in some embodiments. In some embodiments, the sacrificial gate electrode layer is subjected to a planarization operation. The sacrificial gate dielectric layer and the sacrificial gate electrode layer are deposited using CVD, including LPCVD and PECVD, PVD, ALD, or other suitable process. Subsequently, a mask layer is formed over the sacrificial gate electrode layer. The mask layer includes a pad silicon nitride layer 43 and a silicon oxide mask layer 44.

Next, a patterning operation is performed on the mask layer and sacrificial gate electrode layer is patterned into the sacrificial gate structure 40, as shown in FIGS. 4A and 4B. The sacrificial gate structure includes the sacrificial gate dielectric layer 41, the sacrificial gate electrode layer 42 (e.g., poly silicon), the pad silicon nitride layer 43 and the silicon oxide mask layer 44. By patterning the sacrificial gate structure, the stacked layers of the first and second semiconductor layers are partially exposed on opposite sides of the sacrificial gate structure, thereby defining source/drain regions, as shown in FIGS. 4A and 4B. In this disclosure, a source and a drain are interchangeably used and the structures thereof are substantially the same. In FIGS. 4A and 4B, one sacrificial gate structure is formed over two fin structures, but the number of the sacrificial gate structures is not limited to one. Two or more sacrificial gate structures are arranged in the X direction in some embodiments. In certain embodiments, one or more dummy sacrificial gate structures are formed on both sides of the sacrificial gate structures to improve pattern fidelity.

Further, a first cover layer 45 for sidewall spacers is formed over the sacrificial gate structure 40, as shown in FIGS. 4A and 4B. The first cover layer 45 is deposited in a conformal manner so that it is formed to have substantially equal thicknesses on vertical surfaces, such as the sidewalls, horizontal surfaces, and the top of the sacrificial gate structure, respectively. In some embodiments, the first cover layer 45 has a thickness in a range from about 5 nm to about 20 nm. The first cover layer 45 includes one or more of silicon nitride, SiON, SiCN, SiCO, SiOCN or any other suitable dielectric material. The cover layer 45 can be formed by ALD or CVD, or any other suitable method.

Figure 5:
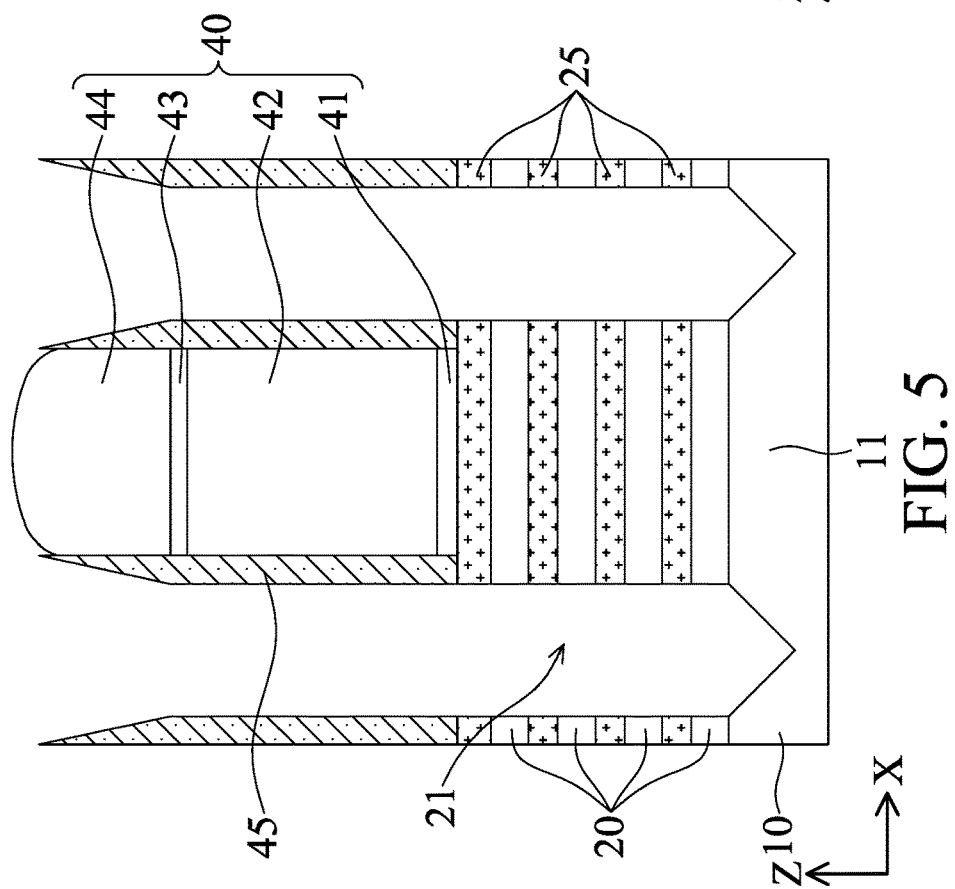
FIG. 5 shows one of the various stages of manufacturing a semiconductor GAA FET device according to an embodiment of the present disclosure.

FIG. 5 shows a cross sectional view along the X direction. Next, as shown in FIG. 5, the first cover layer 45 is anisotropicaly etched to remove the first cover layer 45 disposed on the source/drain region, while leaving the first cover layer 45 as sidewall spacers on side faces of the sacrificial gate structure 40. Then the stacked structure of the first semiconductor layers 20 and the second semiconductor layer 25 is etched down at the source/drain region, by using one or more lithography and etching operations, thereby forming a source/drain space 21. In some embodiments, the substrate 10 (or the bottom part of the fin structures 11) is also partially etched. In some embodiments, an n-type FET and a p-type FET are manufactured separately, and in such a case, a region for one type of FET is processed, and a region for the other type of FET is covered by a protective layer, such as a silicon nitride. In some embodiments, as shown in FIG. 5, the recessed fin structure has a V-shape showing (111) facets of silicon crystal. In other embodiments, the recess has a reverse trapezoid shape, a rectangular shape or a U-shape.

In some embodiments, the V-shape recess is formed by a dry etching process, which may be anisotropic. The anisotropic etching process may be performed using a process gas mixture including $BF_2$, $Cl_2$, $CH_3F$, $CH_4$, HBr, $O_2$, Ar, other etchant gases. The plasma is a remote plasma that is generated in a separate plasma generation chamber connected to the processing chamber. Process gases may be activated into plasma by any suitable method of generating the plasma, such as transformer coupled plasma (TCP) systems, inductively coupled plasma (ICP) systems, magnetically enhanced reactive ion techniques. The process gases used in the plasma etching process includes etchant gases such as $H_2$, Ar, other gases, or a combination of gases. In some embodiments, carrier gases, such as $N_2$, Ar, He, Xe. plasma etching process using hydrogen (H) radicals. The H radicals may be formed by flowing $H_2$ gas into a plasma generation chamber and igniting a plasma within the plasma generation chamber. In some embodiments, an additional gas may be ignited into a plasma within the plasma generation chamber, such as Ar. The H radicals may selectively etch (100) planes over (111) planes or (110) planes. In some cases, the etch rate of (100) planes may be about three times greater than the etch rate of (111) planes. Due to this selectivity, the etching by the H radicals may tend to slow or stop along (111) planes or (110) planes of silicon during the second patterning process.

Figure 6:
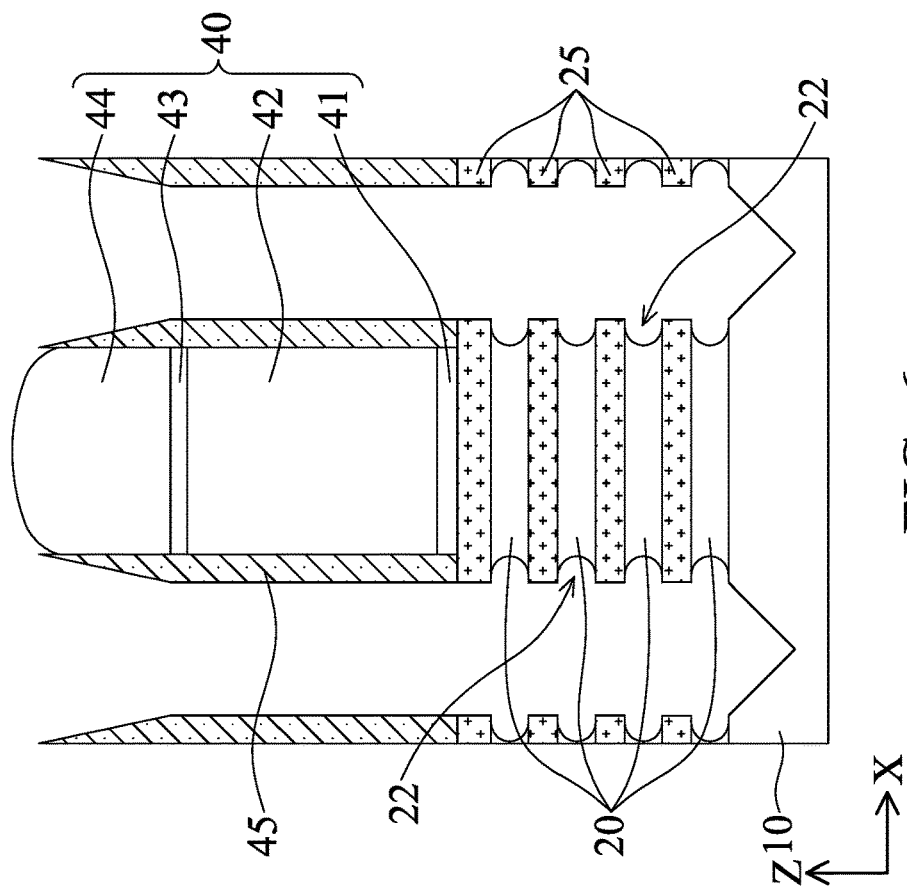
FIG. 6 shows one of the various stages of manufacturing a semiconductor GAA FET device according to an embodiment of the present disclosure.

Further, as shown in FIG. 6, the first semiconductor layers 20 are laterally etched in the X direction within the source/drain space 21, thereby forming cavities 22. When the first semiconductor layers 20 are SiGe and the second semiconductor layers 25 are Si, the first semiconductor layers 20 can be selectively etched by using a wet etchant such as, but not limited to, a mixed solution of $H_2O_2$, $CH_3COOH$ and HF, followed by $H_2O$ cleaning. In some embodiments, the etching by the mixed solution and cleaning by water is repeated 10 to 20 times. The etching time by the mixed solution is in a range from about 1 min to about 2 min in some embodiments. The mixed solution is used at a temperature in a range from about 60° C. to about 90° C. in some embodiments. In some embodiments, other etchants are used.

Figure 7:
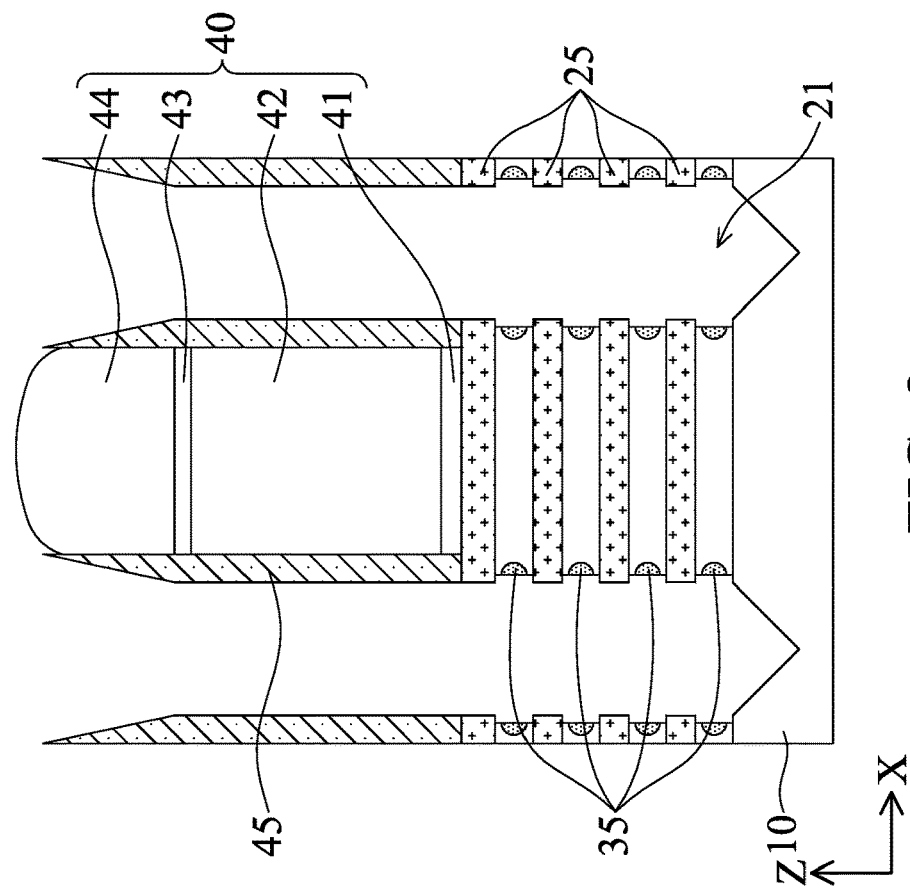
FIG. 7 shows one of the various stages of manufacturing a semiconductor GAA FET device according to an embodiment of the present disclosure.

Next, as shown in FIG. 7, a first insulating layer 30 is conformally formed on the etched lateral ends of the first semiconductor layers 20 and on end faces of the second semiconductor layers 25 in the source/drain space 21 and over the sacrificial gate structure 40. The first insulating layer 30 includes one of silicon nitride and silicon oxide, SiON, SiOC, SiCN and SiOCN, or any other suitable dielectric material. The first insulating layer 30 is made of a different material than the sidewall spacers (first cover layer) 45. The first insulating layer 30 has a thickness in a range from about 1.0 nm to about 10.0 nm in some embodiments. In other embodiments, the first insulating layer 30 has a thickness in a range from about 2.0 nm to about 5.0 nm. The first insulating layer 30 can be formed by ALD or any other suitable methods. By conformally forming the first insulating layer 30, the cavities 22 are fully filled with the first insulating layer 30.

Figure 8:
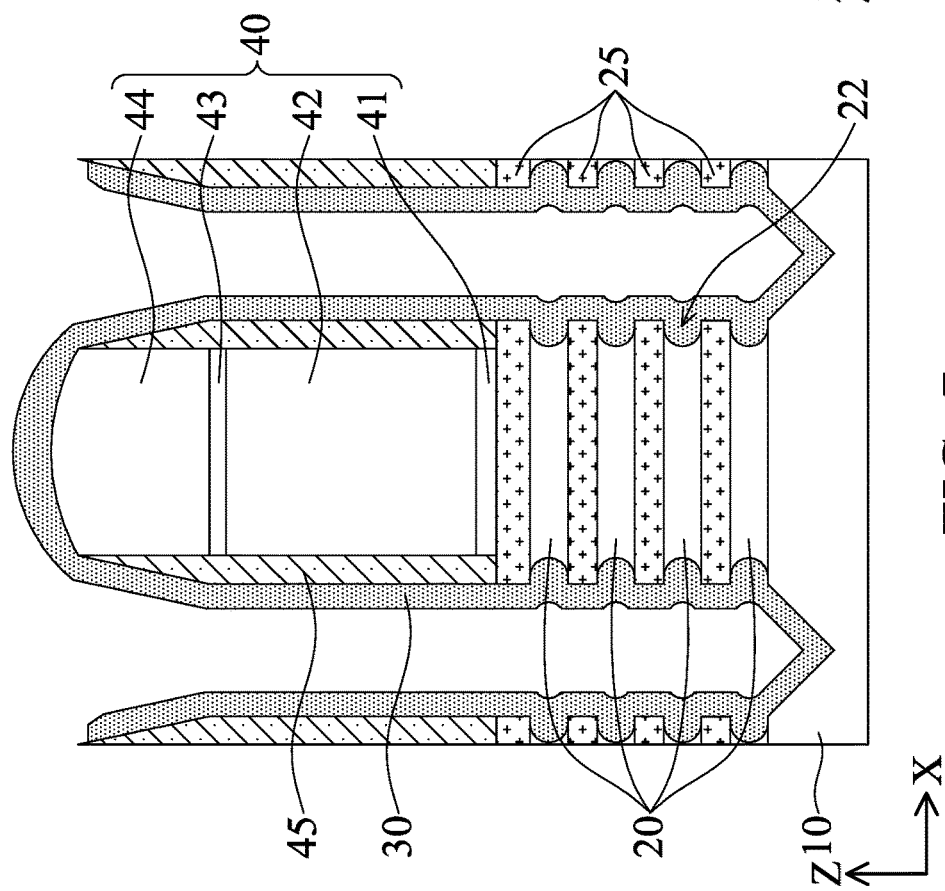
FIG. 8 shows one of the various stages of manufacturing a semiconductor GAA FET device according to an embodiment of the present disclosure.

After the first insulating layer 30 is formed, an etching operation is performed to partially remove the first insulating layer 30, thereby forming inner spacers 35, as shown in FIG. 8. In some embodiments, the end face of the inner spacers 35 is recessed more than the end face of the second semiconductor layers 25. The recessed amount is in a range from about 0.2 nm to about 3 nm and is in a range from about 0.5 nm to about 2 nm in other embodiments. In other embodiments, the recessed amount is less than 0.5 nm and may be equal to zero (the end face of the inner spacer 35 and the end face of the second semiconductor layers 25 are flush with each other).

In some embodiments, before forming the first insulating layer 30, an additional insulating layer having a smaller thickness than the first insulating layer 30 is formed, and thus the inner spacers 35 have a two-layer structure. In some embodiments, widths (lateral length) of the inner spacers 35 are not constant.

Figure 9:
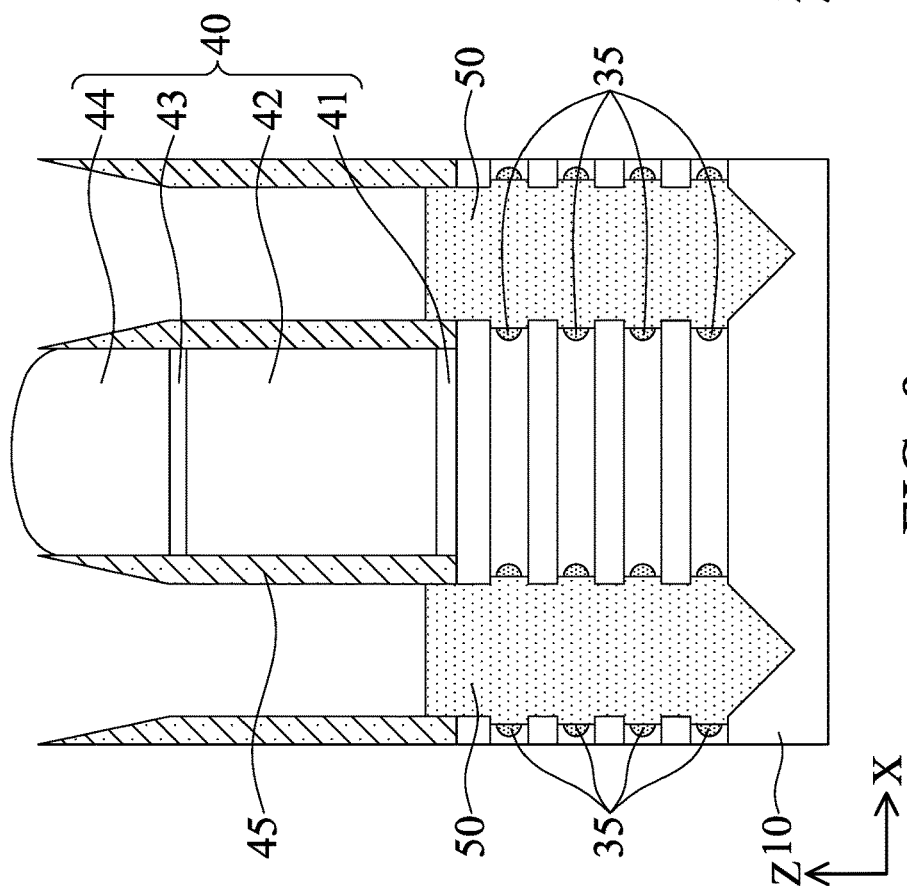
FIG. 9 shows one of the various stages of manufacturing a semiconductor GAA FET device according to an embodiment of the present disclosure.

Subsequently, as shown in FIG. 9, a source/drain epitaxial layer 50 is formed in the source/drain space 21. The operations of forming the source/drain epitaxial layer 50 are explained below with respect to FIGS. 15A-15F. The source/drain epitaxial layer 50 is formed by an epitaxial growth method using CVD, ALD or molecular beam epitaxy (MBE). As shown in FIG. 9, the source/drain epitaxial layer 50 is selectively formed on semiconductor regions. The source/drain epitaxial layer 50 is formed in contact with end faces of the second semiconductor layers 25, and formed in contact with the inner spacers 35.

Figure 10:
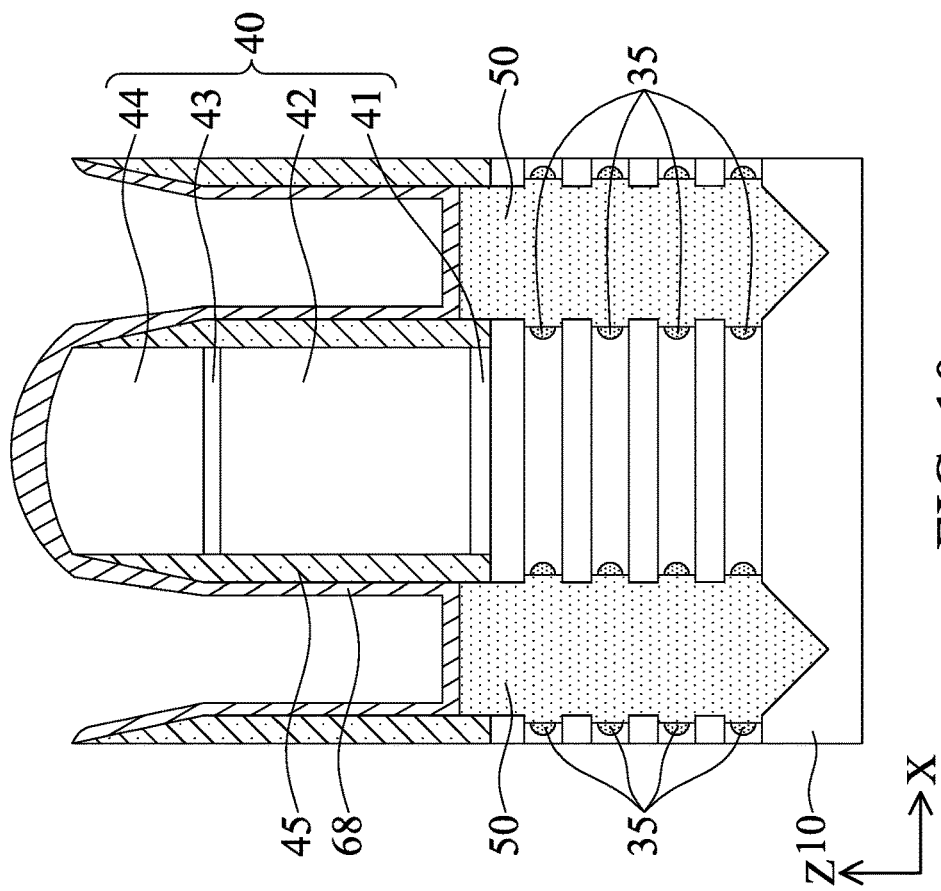
FIG. 10 shows one of the various stages of manufacturing a semiconductor GAA FET device according to an embodiment of the present disclosure.

Then, as shown in FIG. 10, an etch stop layer 68 is formed. The etch stop layer 68 includes one of silicon nitride and silicon oxide, SiON, SiOC, SiCN and SiOCN, or any other suitable dielectric material. The etch stop layer 68 is made of a different material than the sidewall spacers (first cover layer) 45. The etch stop layer 68 can be formed by ALD or any other suitable methods.

Figure 11:
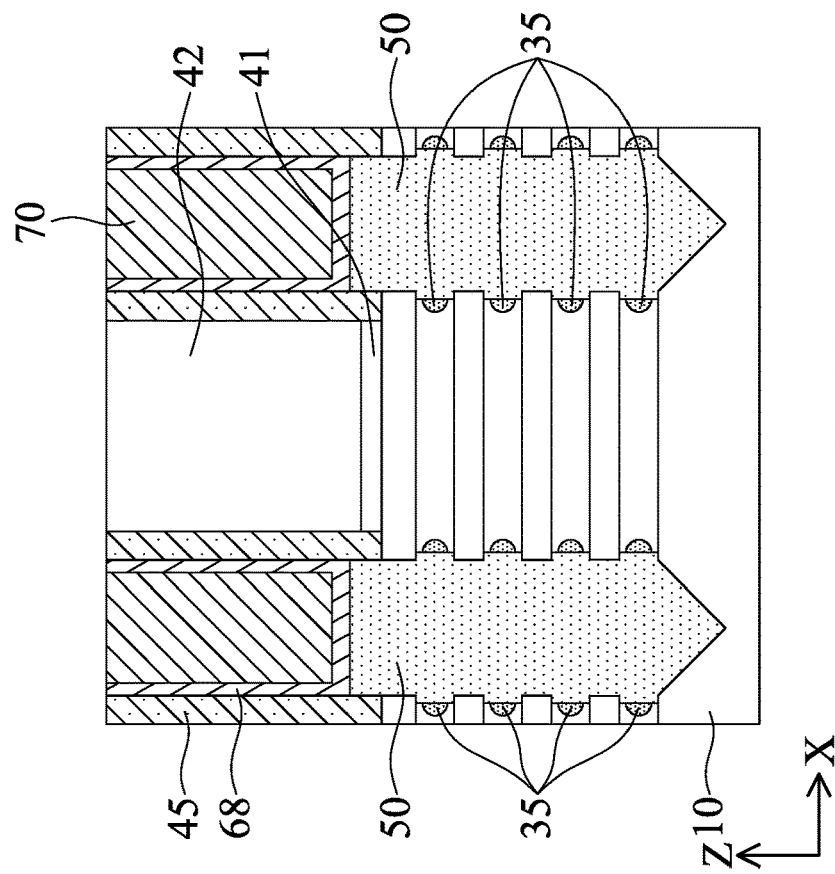
FIG. 11 shows one of the various stages of manufacturing a semiconductor GAA FET device according to an embodiment of the present disclosure.
Figure 12:
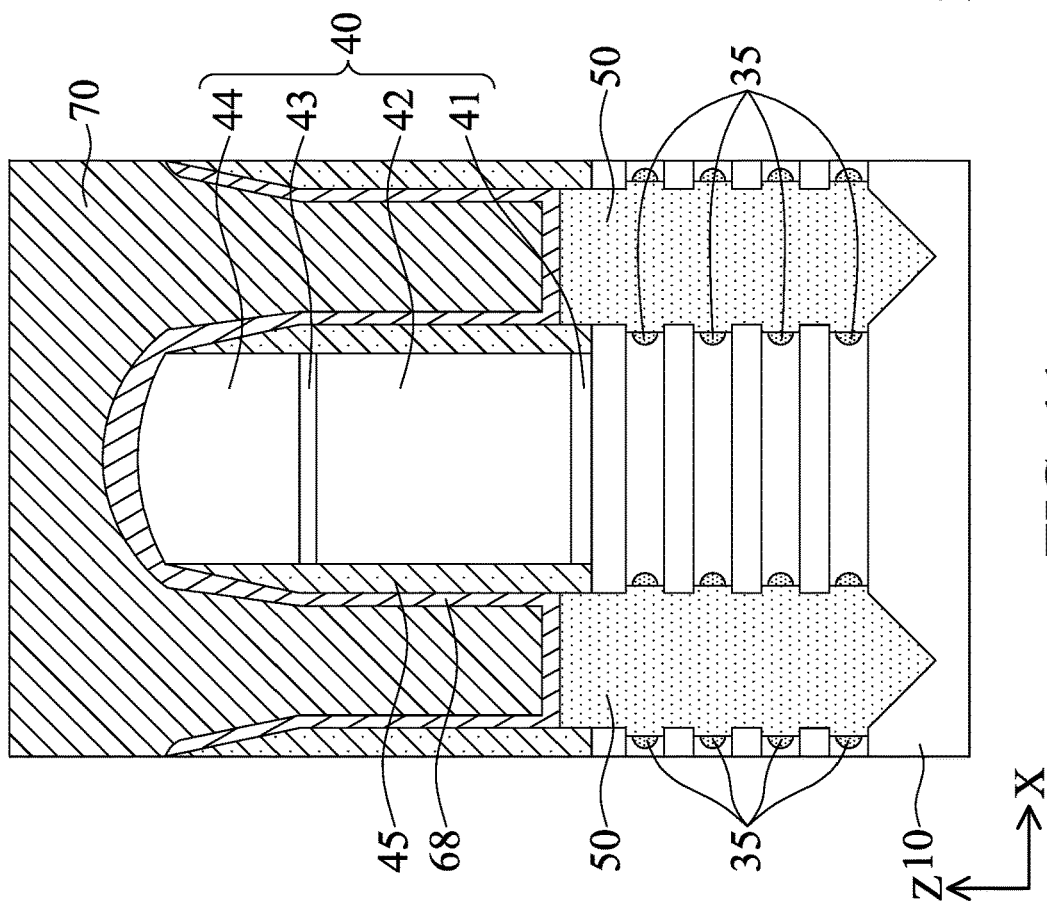
FIG. 12 shows one of the various stages of manufacturing a semiconductor GAA FET device according to an embodiment of the present disclosure.

Next, as shown in FIG. 11, a first interlayer dielectric (ILD) layer 70 is formed over the etch stop layer 68. The materials for the ILD layer 70 include compounds comprising Si, O, C and/or H, such as silicon oxide, SiCOH and SiOC. Organic materials, such as polymers, may be used for the ILD layer 70. After the ILD layer 70 is formed, a planarization operation, such as CMP, is performed, so that the top portion of the sacrificial gate electrode layer 42 is exposed, as shown in FIG. 12.

Then, the sacrificial gate electrode layer 42 and sacrificial gate dielectric layer 41 are removed. The ILD layer 70 protects the source/drain epitaxial layers 50 and 55 during the removal of the sacrificial gate structures. The sacrificial gate structures can be removed using plasma dry etching and/or wet etching. When the sacrificial gate electrode layer 42 is polysilicon and the ILD layer 70 is silicon oxide, a wet etchant such as a TMAH solution can be used to selectively remove the sacrificial gate electrode layer 42. The sacrificial gate dielectric layer 41 is thereafter removed using plasma dry etching and/or wet etching.

Figure 13:
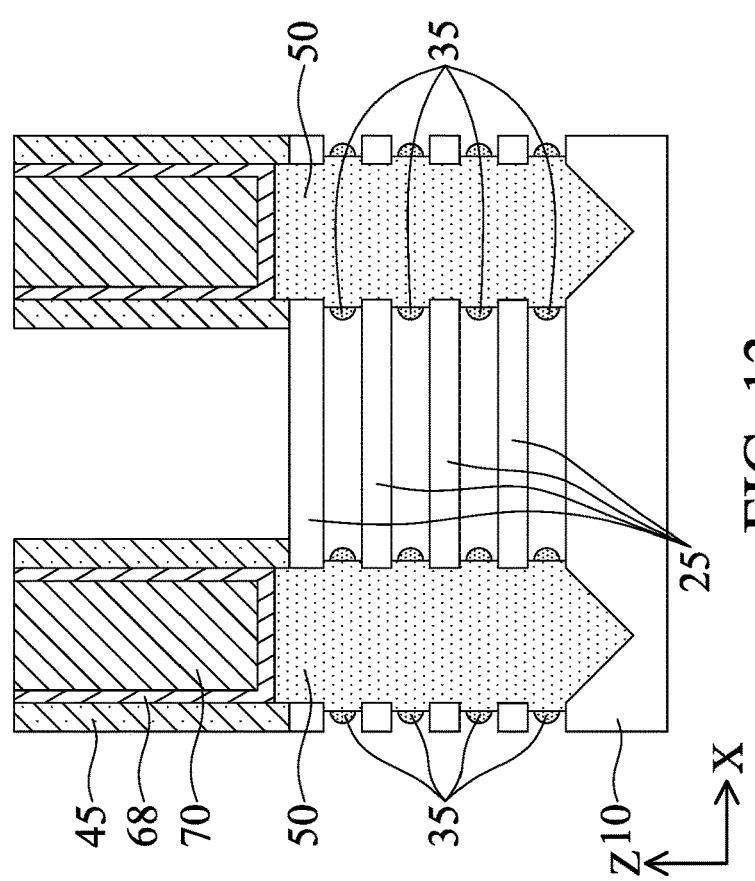
FIG. 13 shows one of the various stages of manufacturing a semiconductor GAA FET device according to an embodiment of the present disclosure.

After the sacrificial gate structures are removed, the first semiconductor layers 20 are removed, thereby forming wires (channel regions) of the second semiconductor layers 25, as shown in FIG. 13. The first semiconductor layers 20 can be removed or etched using an etchant that can selectively etch the first semiconductor layers 20 against the second semiconductor layers 25, as set forth above. As shown in FIG. 13, since the first insulating layers (inner spacers) 35 are formed, the etching of the first semiconductor layers 20 stops at the first insulating layer 35. In other words, the first insulating layer 35 functions as an etch-stop layer for etching of the first semiconductor layers 20.

Figure 14:
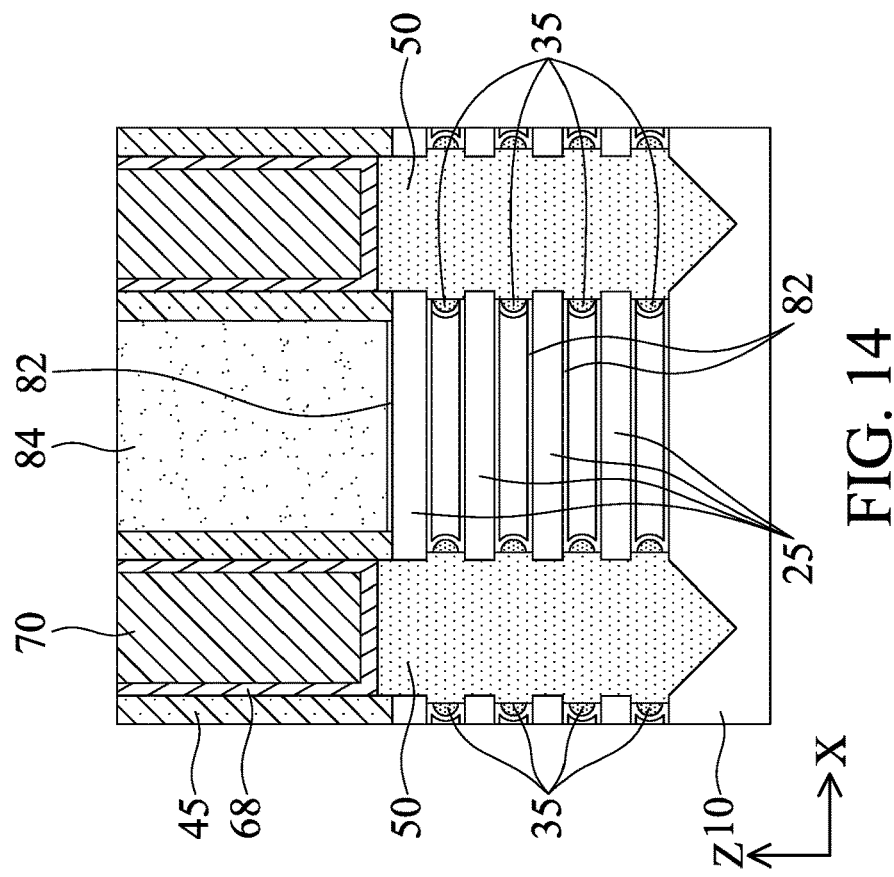
FIG. 14 shows one of the various stages of manufacturing a semiconductor GAA FET device according to an embodiment of the present disclosure.

After the semiconductor wires (channel regions) of the second semiconductor layers 25 are formed, a gate dielectric layer 82 is formed around each channel regions. Further, a gate electrode layer 84 is formed on the gate dielectric layer 82, as shown in FIG. 14. In some embodiments, the structure and/or material of the gate electrode for the n-type GAA FET are different from the structure and/or material of the gate electrode for the p-type GAA FET.

In certain embodiments, the gate dielectric layer 82 includes one or more layers of a dielectric material, such as silicon oxide, silicon nitride, or high-k dielectric material, other suitable dielectric material, and/or combinations thereof. Examples of high-k dielectric material include $HfO_2$, HfSiO, HfSiON, HfTaO, HfTiO, HfZrO, zirconium oxide, aluminum oxide, titanium oxide, hafnium dioxide-alumina ($HfO_2$—$Al_2O_3$) alloy, other suitable high-k dielectric materials, and/or combinations thereof. In some embodiments, the gate dielectric layer 82 includes an interfacial layer (not shown) formed between the channel layers and the dielectric material.

The gate dielectric layer 82 may be formed by CVD, ALD or any suitable method. In one embodiment, the gate dielectric layer 82 is formed using a highly conformal deposition process such as ALD in order to ensure the formation of a gate dielectric layer having a uniform thickness around each channel layers. The thickness of the gate dielectric layer 82 is in a range from about 1 nm to about 6 nm in one embodiment.

The gate electrode layer 84 is formed on the gate dielectric layer 82 to surround each channel layer. The gate electrode 84 includes one or more layers of conductive material, such as polysilicon, aluminum, copper, titanium, tantalum, tungsten, cobalt, molybdenum, tantalum nitride, nickel silicide, cobalt silicide, TiN, WN, TiAl, TiAlN, TaCN, TaC, TaSiN, metal alloys, other suitable materials, and/or combinations thereof.

The gate electrode layer 84 may be formed by CVD, ALD, electro-plating, or other suitable method. The gate electrode layer is also deposited over the upper surface of the ILD layer 70. The gate dielectric layer and the gate electrode layer formed over the ILD layer 70 are then planarized by using, for example, CMP, until the top surface of the ILD layer 70 is revealed. In some embodiments, after the planarization operation, the gate electrode layer 84 is recessed and a cap insulating layer (not shown) is formed over the recessed gate electrode 84. The cap insulating layer includes one or more layers of a silicon nitride-based material, such as silicon nitride. The cap insulating layer is formed by depositing an insulating material followed by a planarization operation.

In certain embodiments of the present disclosure, one or more work function adjustment layers (not shown) are interposed between the gate dielectric layer 82 and the gate electrode 84. The work function adjustment layers are made of a conductive material such as a single layer of TiN, TaN, TaAlC, TiC, TaC, Co, Al, TiAl, HfTi, TiSi, TaSi or TiAlC, or a multilayer of two or more of these materials. In some embodiments, one or more of TiAlC, Al, TiAl, TaN, TaAlC, TiN, TiC and Co are used as the work function adjustment layer for the p-channel FET. For an n-channel FET, one or more of TaN, TaAlC, TiN, TiC, Co, TiAl, TiSi and TaSi is used as the work function adjustment layer. The work function adjustment layer may be formed by ALD, PVD, CVD, e-beam evaporation, or other suitable process. Further, the work function adjustment layer may be formed separately for the n-channel FET and the p-channel FET which may use different metal layers.

Subsequently, contact holes are formed in the ILD layer 70 and the etch stop layer 68 by using dry etching, thereby exposing the upper portion of the source/drain epitaxial layer 50. In some embodiments, a silicide layer is formed over the source/drain epitaxial layer 50. The silicide layer includes one or more of WSi, CoSi, NiSi, TiSi, MoSi and TaSi. Then, a conductive contact layer 72 is formed in the contact holes as shown in FIGS. 1A-1D. The conductive contact layer 72 includes one or more of Co, Ni, W, Ti, Ta, Cu, Al, TiN and TaN. Further, a conductive contact plug 75 is formed on the conductive contact layer 72. The conductive contact plug 75 includes one or more layers of Co, Ni, W, Ti, Ta, Cu, Al, TiN and TaN.

It is understood that the GAA FETs undergo further CMOS processes to form various features such as contacts/vias, interconnect metal layers, dielectric layers, passivation layers, etc.

Figure 15B:
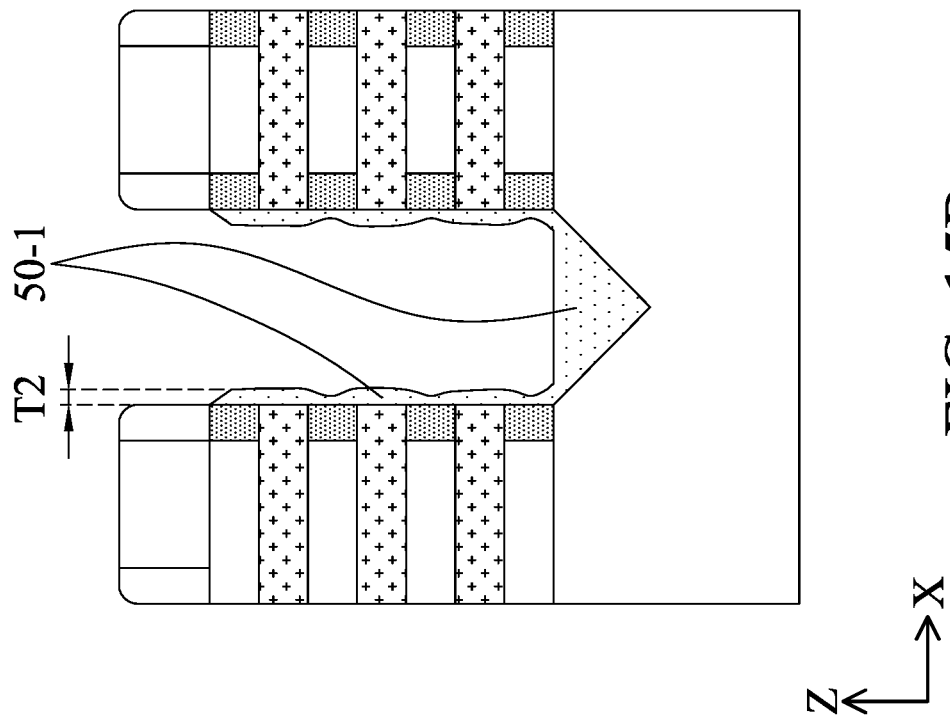
FIGS. 15A, 15B, 15C, 15D, 15E and 15F shows various stages of manufacturing a semiconductor GAA FET device according to an embodiment of the present disclosure.
Figure 16:
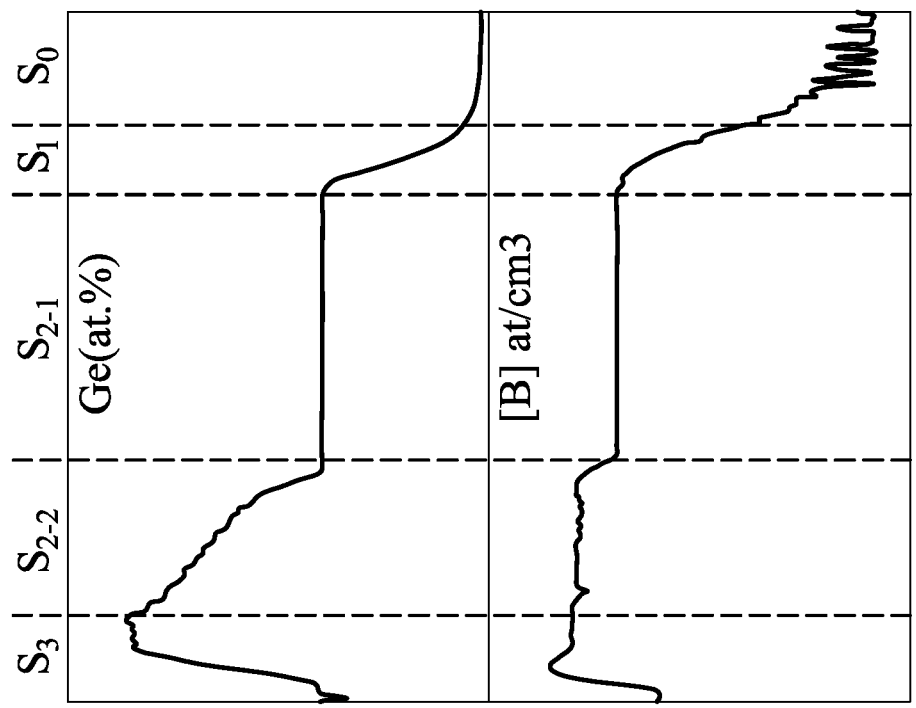
FIG. 16 shows a composition change (profile) of a source/drain epitaxial layer according to an embodiment of the present disclosure.
Figure 16:
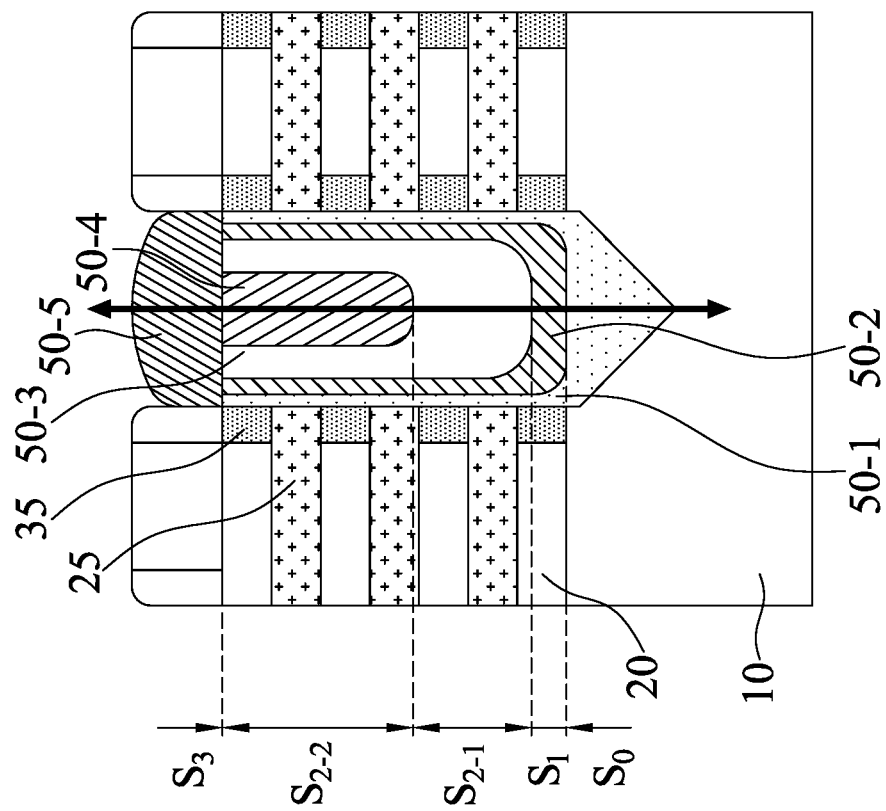
Figure 17:
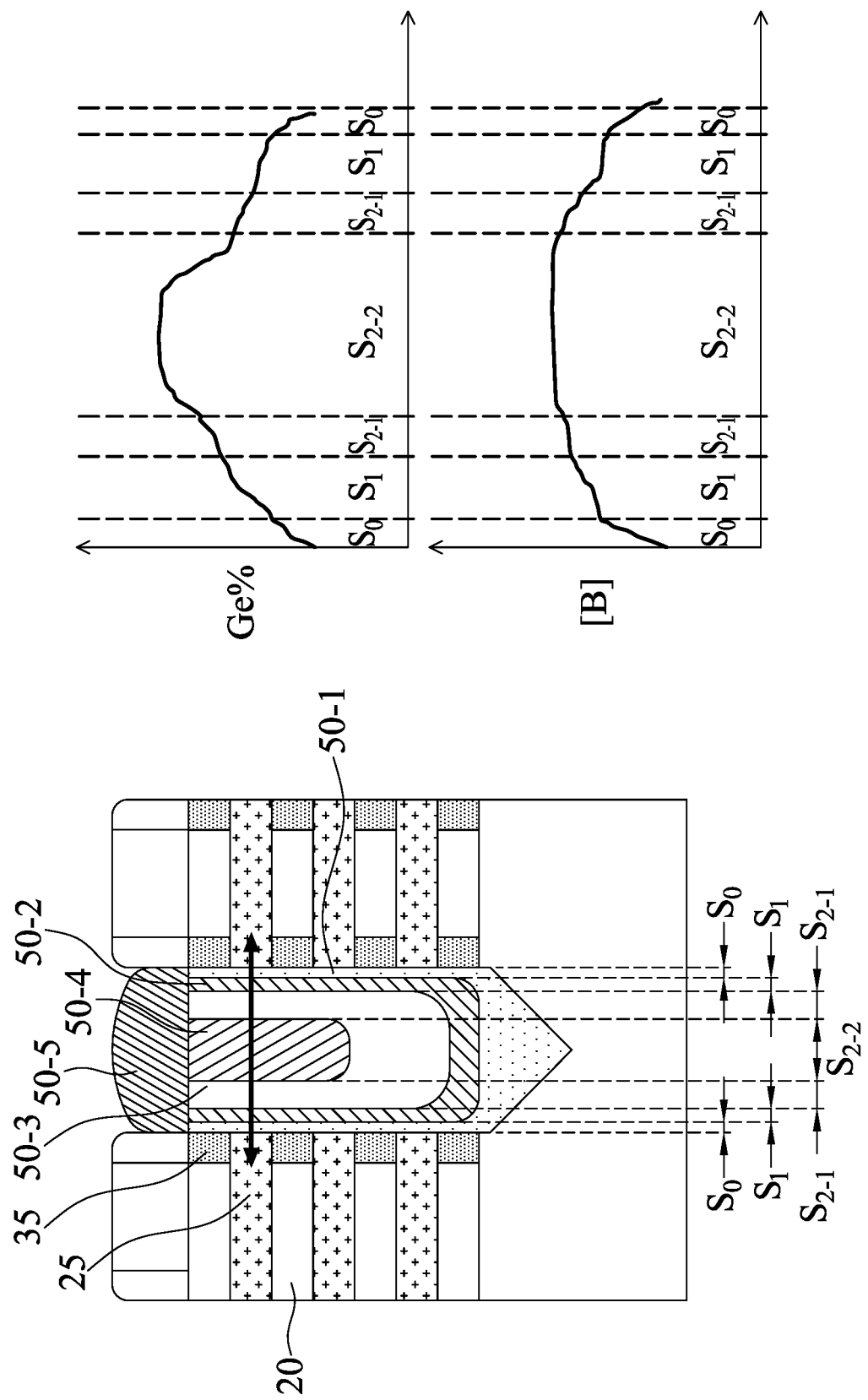
FIG. 17 shows composition changes (profile) of a source/drain epitaxial layer according to an embodiments of the present disclosure.

FIGS. 15A-15F show process steps for manufacturing a source/drain epitaxial layer 50 according to embodiments of the present disclosure. FIGS. 16 and 17 show vertical and lateral elemental profiles of the source/drain epitaxial layer 50. In FIGS. 15A-15F, the X direction is the horizontal direction which corresponds to the channel extending direction or the (110) direction, and the Z direction is the vertical direction which corresponds to the (100) direction of the substrate (normal direction to the principal surface of the substrate).

Figure 15A:
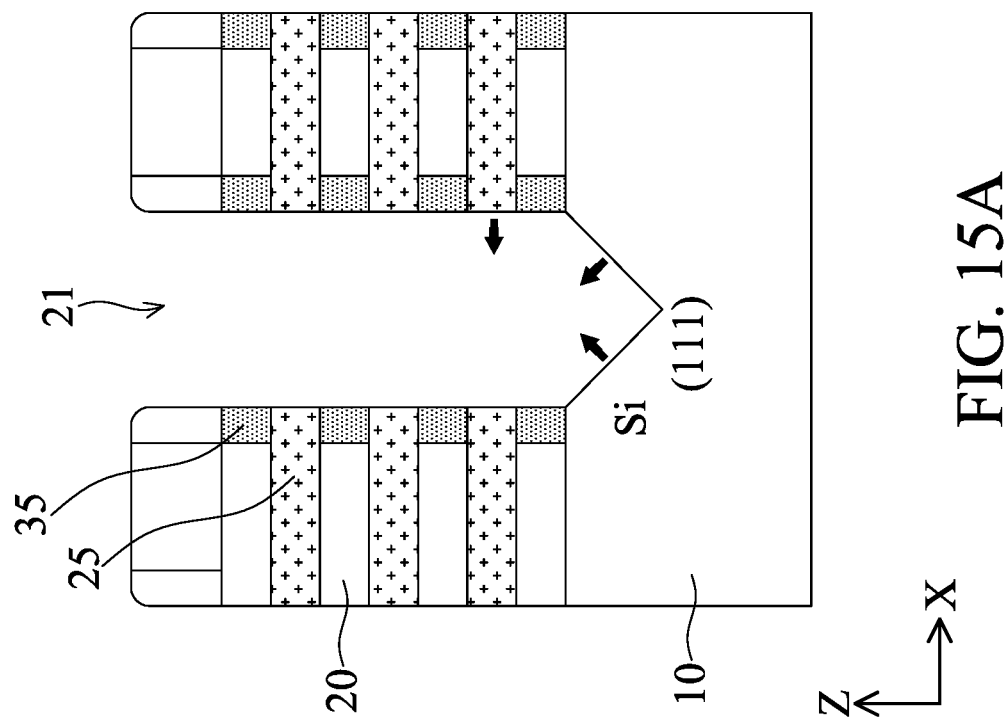

FIG. 15A show a cross sectional view after the source/drain space 21 is formed. After the source/drain space 21 is formed, a pre-clean operation is performed to remove an oxide layer formed on the surface of the recessed fin structure. In some embodiments, the pre-clean operation includes a plasma treatment using Ar and/or $NH_3$ plasma. The process temperature is in a range from about room temperature to about 300° C. in some embodiments. Then, a chemical cleaning operation is performed using a HCl gas to remove residual gases from a vacuum chamber, which would otherwise cause defects at N/P boundary and nodule-like defects. The process temperature of the chemical cleaning is higher than the pre-clean temperature and is in a range from about 400° C. to about 700° C. in some embodiments and is in a range from about 500° C. to about 600° C. in other embodiments.

After the chemical cleaning, a first epitaxial layer 50-1 (Region $S_0$ shown in FIGS. 16 and 17) as a seed layer is formed. In some embodiments, the first epitaxial layer 50-1 is a silicon layer. In other embodiments, the first epitaxial layer 50-1 is a SiGe layer. In other embodiments, the first epitaxial layer is multilayers of Si and SiGe. In some embodiments, the first epitaxial layer 50-1 is doped with B. In other embodiment, the first epitaxial layer 50-1 is pure (non-doped) Si. The process temperature of forming the first epitaxial layer 50-1 is higher than that of the chemical cleaning operation and is in a range from about 550° C. to about 750° C. in some embodiments and is in a range from about 600° C. to about 650° C. in other embodiments, where the temperature is substantially equal to a temperature for forming channel regions so that quality of the first epitaxial layer as a seed layer is improved and interface defects can be avoided. The thickness T2 of the first epitaxial layer 50-1 measured in the horizontal direction at the end of the second semiconductor layer 25 is in a range from about 5 nm to about 20 nm, which is the critical thickness without defects. As shown in FIG. 15B, the first epitaxial layer 50-1 fills the V-shape recess of the fin structure.

In some embodiments, the first epitaxial layer 50-1 grows from Si surfaces, e.g., ends of the second semiconductor layers 25 and the bottom of the V-shape recess. In some embodiments, the ends of the second semiconductor layers 25 are (110) faces. Since a growth rate on a (110) face is greater than that on and (111) surfaces, the first epitaxial layer 50-1 grown on the ends of the second semiconductor layers 25 merges with each other first and then merges with the first epitaxial layer 50-1 grown from the V-shape recess. In particular, an inner spacer 35 at the bottommost second semiconductor layer 25 and the V-shape recess prevents the first epitaxial layer 50-1 grown on the ends of the second semiconductor layers 25 from merging with the first epitaxial layer 50-1 grown from the V-shape recess earlier in the epitaxial process. Subsequently, the first epitaxial layer 50-1 covers the inner spacers 35 as shown in FIG. 15B. In some embodiments, the first epitaxial layer 50-1 has a larger thickness in the horizontal direction (e.g., channel extending direction or (100) direction) on the end of the second semiconductor layer 25 than on the inner spacer 35. In some embodiments, the first epitaxial layer is grown using gases mixed of $SiH_4$ and HCl. The gas mixture simultaneously etches and deposits a semiconductor layer to control the shape of the first epitaxial layer 50-1. In some embodiments, the $SiH_4$ gas helps the growth of Si film on the (100) substrate surface and the HCl gas selectively etches the (110) surface rather than the (111) surface. In other embodiments, the ends of the second semiconductor layers 25 are (100) faces and a growth rate on a (100) face is greater than that on (111) and or (110) face.

In some embodiments, after the first epitaxial layer 50-1 as the seed layer is formed, a baking/annealing operation is performed to control the shape of the epitaxial layer subsequently formed. In some embodiments, the baking/annealing operation is performed in an $H_2$ ambient. The process temperature is higher than that of the chemical cleaning operation and that of forming the first epitaxial layer 50-1, and is in a range from about 700° C. to about 800° C. in some embodiments. The banking/annealing process helps to reconstruct the seed layer and improve the quality of the film. In some embodiment, baking/annealing out diffuse unwanted hydrogen or fluorine content from the film. The process temperature of the baking in the $H_2$ ambient is higher than the process temperature of the first epitaxial layer to facilitate re-crystallization and improvement of the first epitaxial layer 50-1. During process there may have H— or Cl— contain in the film which lead to damage or point defect, therefore baking improves quality of seed layer.

Figures 15C, 15D:
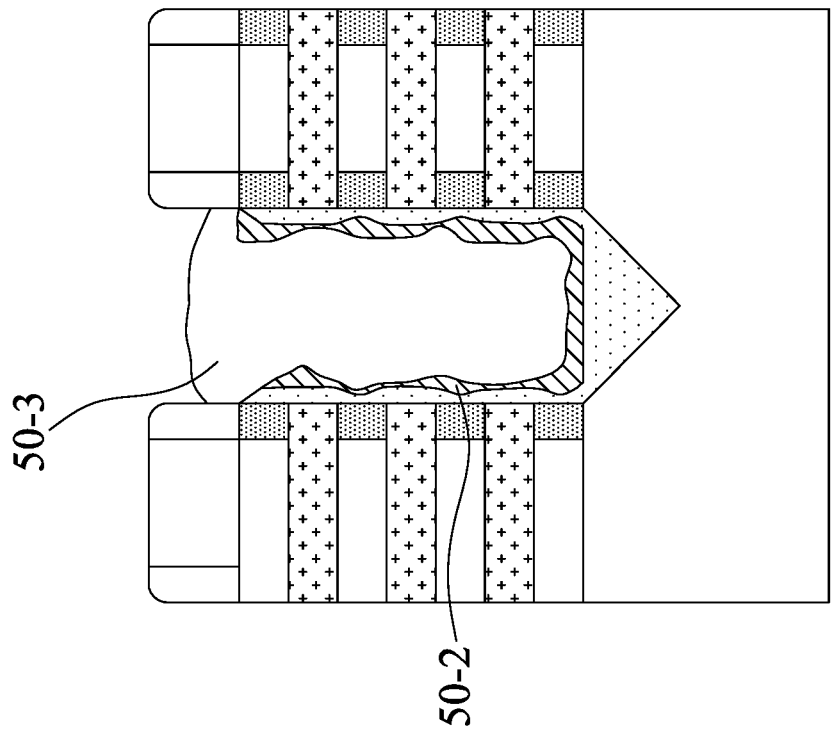

FIG. 15C shows forming a second epitaxial layer 50-2 (Region Si shown in FIGS. 16 and 17) to suppress defect in the source/drain epitaxial layer. In some embodiments, the second epitaxial layer 50-2 is made of SiGe doped with B. In some embodiments, the Ge content increases as the second epitaxial layer 50-2 is grown. In some embodiments, the Ge content increases from about 0 atomic % (Si). In some embodiments, the Ge content increases up to about 15-25 atomic %, for example, 20 atomic % ($Si_{0.8}Ge_{0.2}$). In some embodiments, the average B concentration of the second epitaxial layer 50-2 is in a range from about $1\times10^{19}$ atoms/$cm^3$ to about $1\times10^{21}$ atoms/$cm^3$, and is in a range from about $5\times10^{19}$ atoms/$cm^3$ to about $5\times10^{20}$ atoms/$cm^3$ in other embodiments. In some embodiments, the B concentration increases as the second epitaxial layer 50-2 is grown.

The thickness of the second epitaxial layer 50-2 measured in the horizontal direction over the second semiconductor layer 25 is in a range from about 2 nm to about 10 nm in some embodiments. When the Ge concentration is high, the thickness of the second epitaxial layer 50-2 is small (critical thickness on a (110) surface). For example, when the Ge concentration of second epitaxial layer 50-2 is 20 atomic %, the thickness is equal to or less than 20 nm, when the Ge concentration of second epitaxial layer 50-2 is 30 atomic %, the thickness is equal to or less than 10 nm, and when the Ge concentration of second epitaxial layer 50-2 is 40 atomic %, the thickness is equal to or less than 6 nm.

The process temperature for forming the second epitaxial layer 50-2 is lower than that of the baking/annealing operation and higher than the temperature for forming the first epitaxial layer 50-1. In some embodiments, the process temperature for forming the second epitaxial layer 50-2 is in a range from about 550° C. to about 750° C. and is in a range from about 600° C. to about 700° C. in other embodiments.

After the second epitaxial layer 50-2 is formed, a third epitaxial layer 50-3 (Region S2-1 shown in FIGS. 16 and 17) is formed as shown in FIG. 15D to improve on-current (Ion) of an FET device. In some embodiments, the third epitaxial layer 50-3 is made of SiGe doped with B. In some embodiments, the Ge content of the third epitaxial layer is substantially constant (±2%) and is in a range from about 20 atomic % to about 30 atomic % in some embodiments. In some embodiments, the average B concentration of the third epitaxial layer 50-3 is equal to or higher than the largest B concentration of the second epitaxial layer 50-2, and is in a range from about $0.5 \times 10^{20}$ atoms/cm$^3$ to about $1 \times 10^{21}$ atoms/cm$^3$, and is in a range from about $1 \times 10^{20}$ atoms/cm$^3$ to about $5 \times 10^{20}$ atoms/cm$^3$ in other embodiments. The thickness of the third epitaxial layer 50-3 measured in the horizontal direction at the end of the second semiconductor layer 25 is in a range from about 20 nm to about 50 nm in some embodiments, depending on the design and/or process requirements.

The process temperature for forming the third epitaxial layer 50-3 is lower than that of the baking/annealing operation and higher than the temperature for forming the first epitaxial layer 50-1. In some embodiments, the process temperature for forming the third epitaxial layer 50-3 is in a range from about 550° C. to about 750° C. and is in a range from about 600° C. to about 700° C. in other embodiments.

Figure 15F:
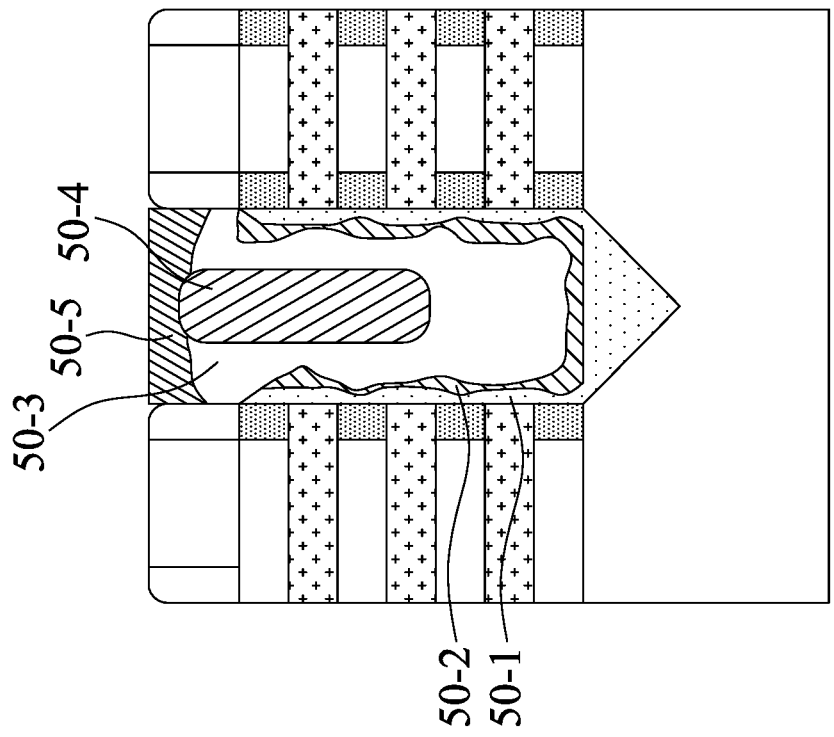

In some embodiments, as shown in FIG. 15F, a fourth epitaxial layer 50-4 (Region S2-2 shown in FIGS. 16 and 17) is formed over the third epitaxial layer 50-3 to facilitate an alloy (silicide) formation subsequently performed. In some embodiments, the fourth epitaxial layer 50-4 is made of SiGe doped with B. In some embodiments, the Ge content increases as the fourth epitaxial layer 50-4 is grown. In some embodiments, the Ge content increases from about 20-30 atomic % to about 30-60 atomic %. In some embodiments, the average Ge content of the fourth epitaxial layer is greater than the Ge content of the third epitaxial layer. In some embodiments, the average B concentration of the fourth epitaxial layer 50-4 is in a range from about $5 \times 10^{19}$ atoms/cm$^3$ to about $5 \times 10^{21}$ atoms/cm$^3$, and is in a range from about $1 \times 10^{20}$ atoms/cm$^3$ to about $3 \times 10^{21}$ atoms/cm$^3$ in other embodiments. In some embodiments, the B concentration is substantially constant in the fourth epitaxial layer 50-4. The thickness of the fourth epitaxial layer 50-4 measured in the horizontal direction at the end of the second semiconductor layer 25 is in a range from about 10 nm to about 30 nm in some embodiments, depending on the design and/or process requirements.

The process temperature for forming the fourth epitaxial layer 50-4 is lower than that of the baking/annealing operation and higher than the temperature for forming the first epitaxial layer 50-1. In some embodiments, the process temperature for forming the fourth epitaxial layer 50-4 is in a range from about 550° C. to about 750° C. and is in a range from about 600° C. to about 700° C. in other embodiments. In other embodiments, the fourth epitaxial layer 50-4 is not formed as shown in FIG. 15E.

Figure 15E:
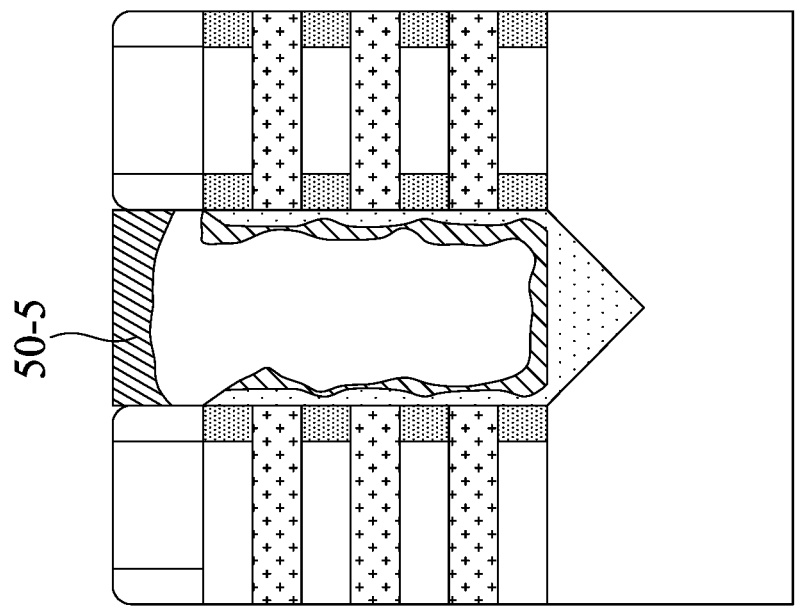

After the fourth (or third) epitaxial layer is formed, a fifth epitaxial layer 50-5 (Region S3 shown in FIGS. 16 and 17) as a cap epitaxial layer is formed as shown in FIGS. 15E and 15F. In some embodiments, the fifth epitaxial layer 50-5 is made of SiGe doped with B. In some embodiments, the Ge content decreases as the epitaxial layer 50-5 is grown. In some embodiments, the Ge content decreases from about 30-60 atomic % to about 20-30 atomic %. In some embodiments, the Ge content is substantially constant and is in a range from about 40 atomic % to about 60 atomic %. In some embodiments, the average Ge content of the fifth epitaxial layer is smaller than the Ge content of the fourth epitaxial layer and higher than that of the third epitaxial layer. In some embodiments, the average B concentration of the fifth epitaxial layer 50-5 is in a range from about $1 \times 10^{20}$ atoms/cm$^3$ to about $5 \times 10^{21}$ atoms/cm$^3$, and is in a range from about $5 \times 10^{20}$ atoms/cm$^3$ to about $2 \times 10^{21}$ atoms/cm$^3$ in other embodiments. In some embodiments, the B concentration decreases as the growth of the fifth epitaxial layer 50-5. In other embodiments, the B concentration is substantially constant in the fifth epitaxial layer 50-5. The thickness of the fifth epitaxial layer 50-5 measured in the vertical direction over the fourth/third epitaxial layer is in a range from about 10 nm to about 30 nm in some embodiments, depending on the design and/or process requirements. The process temperature for forming the fifth epitaxial layer 50-5 is in a range from about 600° C. to about 700° C. in some embodiments.

It will be understood that not all advantages have been necessarily discussed herein, no particular advantage is required for all embodiments or examples, and other embodiments or examples may offer different advantages.

In accordance with one aspect of the present disclosure, in a method of manufacturing a semiconductor device, a fin structure in which first semiconductor layers and second semiconductor layers are alternately stacked is formed, a sacrificial gate structure is formed over the fin structure, a source/drain region of the fin structure, which is not covered by the sacrificial gate structure, is etched, thereby forming a source/drain space, the first semiconductor layers are laterally etched through the source/drain space, and a source/drain epitaxial layer is formed in the source/drain space. In the forming of the source/drain epitaxial layer, a first epitaxial layer is formed, a second epitaxial layer having a higher Ge content than the first epitaxial layer is formed on the first epitaxial layer, a third epitaxial layer having a higher Ge content than the second epitaxial layer is formed on the second epitaxial layer, and a fourth epitaxial layer having a higher Ge content than the third epitaxial layer is formed over the third epitaxial layer. In one or more of the foregoing and following embodiments, a Ge content of the second epitaxial layer increases as growth of the second epitaxial layer. In one or more of the foregoing and following embodiments, the second epitaxial layer includes B, and a B concentration of the second epitaxial layer increases as growth of the second epitaxial layer. In one or more of the foregoing and following embodiments, a Ge content of the third epitaxial layer is constant. In one or more of the foregoing and following embodiments, a Ge content of the fourth epitaxial layer increases as growth of the fourth epitaxial layer. In one or more of the foregoing and following embodiments, before forming the fourth epitaxial layer, a fifth epitaxial layer having a higher Ge concentration than the third epitaxial layer is formed on the third epitaxial layer. In one or more of the foregoing and following embodiments, a Ge content of the fifth epitaxial layer is constant or increases as growth of the fifth epitaxial layer. In one or more of the foregoing and following embodiments, the first epitaxial layer is non-doped Si or SiGe. In one or more of the foregoing and following embodiments, between forming the first epitaxial layer and forming the second epitaxial layer, an annealing operation is performed in an ambient containing hydrogen at a higher temperature than temperatures for forming the first epitaxial layer and forming the second epitaxial layer. In one or more of the foregoing and following embodiments, before forming the first epitaxial layer, chemical treatment using an HCl gas is performed.

In accordance with another aspect of the present disclosure, in a method of manufacturing a semiconductor device, an upper fin structure in which first semiconductor layers and second semiconductor layers are alternately stacked is formed over a lower fin structure, a sacrificial gate structure is formed over the upper fin structure, a source/drain region of the upper fin structure, which is not covered by the sacrificial gate structure, is etched, thereby forming a source/drain space, the first semiconductor layers are laterally etched through the source/drain space, an inner spacer made of a dielectric material is formed on an end of each of the etched first semiconductor layers, and a source/drain epitaxial layer is formed in the source/drain space to cover the inner spacer. In etching the source/drain region, a part of the lower fin structure is also etched to form a recess, in which a (111) surface is exposed, and the source/drain epitaxial layer includes multiple SiGe layers having different Ge contents. In one or more of the foregoing and following embodiments, the recess has a V-shape or a triangular shape in cross section. In one or more of the foregoing and following embodiments, the source/drain epitaxial layer includes a first epitaxial layer in contact with ends of the second semiconductor layers and the inner spacer, and a second epitaxial layer formed on the first epitaxial layer. In one or more of the foregoing and following embodiments, a Ge content of the second epitaxial layer increases as growth of the second epitaxial layer. In one or more of the foregoing and following embodiments, the source/drain epitaxial layer further includes a third epitaxial layer on the second epitaxial layer and not in contact with the first epitaxial layer. In one or more of the foregoing and following embodiments, the source/drain epitaxial layer further includes a third epitaxial layer sandwiched between portions of the second epitaxial layer. In one or more of the foregoing and following embodiments, the source/drain epitaxial layer further includes a third epitaxial layer sandwiched between portions of the second epitaxial layer. In one or more of the foregoing and following embodiments, an end of each of the second semiconductor layers is an (110) surface. In one or more of the foregoing and following embodiments, a thickness in a channel extending direction of the first epitaxial layer on ends of the second semiconductor layers is greater than a thickness in the channel extending direction of the first epitaxial layer on the inner spacer.

In accordance with another aspect of the present disclosure, a semiconductor device includes semiconductor wires or sheets disposed over a substrate, a source/drain epitaxial layer in contact with the semiconductor wires or sheets, a gate dielectric layer disposed on and wrapping around each channel region of the semiconductor wires or sheets, a gate electrode layer disposed on the gate dielectric layer and wrapping around each channel region, and insulating spacers disposed in spaces, respectively. The spaces are defined by adjacent semiconductor wires or sheets, the gate electrode layer and the source/drain region. The source/drain epitaxial layer includes multiple SiGe layers having different Ge contents. In one or more of the foregoing and following embodiments, a Ge content of at least one of the multiple SiGe layers increases as a growth direction. In one or more of the foregoing and following embodiments, at least one of the multiple SiGe layers includes B, and a B content of the at least one of the multiple SiGe layers increases as a growth direction.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing a semiconductor device, comprising:
   forming a fin structure in which first semiconductor layers and second semiconductor layers are alternately stacked;
   forming a sacrificial gate structure over the fin structure;
   etching a source/drain region of the fin structure, which is not covered by the sacrificial gate structure, thereby forming a source/drain space;
   laterally etching the first semiconductor layers through the source/drain space; and
   forming a source/drain epitaxial layer in the source/drain space,
   wherein the forming the source/drain epitaxial layer comprises:
   forming a first epitaxial layer;
   forming a second epitaxial layer having a higher Ge content than the first epitaxial layer on the first epitaxial layer;
   forming a third epitaxial layer having a higher Ge content than the second epitaxial layer on the second epitaxial layer;
   forming a fourth epitaxial layer having a higher Ge content than the third epitaxial layer over the third epitaxial layer; and
   between forming the first epitaxial layer and forming the second epitaxial layer, performing an annealing operation in an ambient containing hydrogen at a higher temperature than temperatures for forming the first epitaxial layer and forming the second epitaxial layer.

2. The method of claim 1, wherein a Ge content of the second epitaxial layer increases as the second epitaxial layer is grown.

3. The method of claim 2, wherein the second epitaxial layer includes B, and a B concentration of the second epitaxial layer increases as the second epitaxial layer is grown.

4. The method of claim 3, wherein a Ge content of the third epitaxial layer is constant.

5. The method of claim 1, wherein a Ge content of the fourth epitaxial layer increases as the fourth epitaxial layer is grown.

6. The method of claim 1, further comprising forming a fifth epitaxial layer over the fourth epitaxial layer.

7. The method of claim 6, wherein a Ge content of the fifth epitaxial layer decreases as the fifth epitaxial layer is grown.

8. The method of claim 1, further comprising, before forming the first epitaxial layer, performing a chemical treatment using an HCl gas.

9. A method of manufacturing a semiconductor device, comprising:
   forming a fin structure in which first semiconductor layers and second semiconductor layers are alternately stacked;
   forming a sacrificial gate structure over the fin structure;

etching a source/drain region of the fin structure, which is not covered by the sacrificial gate structure, thereby forming a source/drain space;

laterally etching the first semiconductor layers through the source/drain space; and forming a source/drain epitaxial layer in the source/drain space, wherein the forming the source/drain epitaxial layer comprises:

forming a first epitaxial layer;

forming a second epitaxial layer having a higher Ge content than the first epitaxial layer on the first epitaxial layer;

forming a third epitaxial layer having a higher Ge content than the second epitaxial layer on the second epitaxial layer;

forming a fourth epitaxial layer having a higher Ge content than the third epitaxial layer over the third epitaxial layer; and between forming the first epitaxial layer and forming the second epitaxial layer, performing an annealing operation in an ambient containing hydrogen at a higher temperature than temperatures for forming the first epitaxial layer and forming the second epitaxial layer, and the first epitaxial layer is non-doped Si or SiGe.

10. The method of claim 9, wherein a Ge content of the second epitaxial layer increases as the second epitaxial layer is grown.

11. The method of claim 10, wherein the second epitaxial layer includes B, and a B concentration of the second epitaxial layer increases as the second epitaxial layer is grown.

12. The method of claim 11, wherein a Ge content of the third epitaxial layer is constant.

13. The method of claim 9, wherein a Ge content of the fourth epitaxial layer increases as the fourth epitaxial layer is grown.

14. The method of claim 9, further comprising forming a fifth epitaxial layer over the fourth epitaxial layer.

15. The method of claim 14, wherein a Ge content of the fifth epitaxial layer decreases as the fifth epitaxial layer is grown.

16. The method of claim 9, further comprising, before forming the first epitaxial layer, performing a chemical treatment using an HCl gas.

17. A method of manufacturing a semiconductor device, comprising:

forming a fin structure in which first semiconductor layers and second semiconductor layers are alternately stacked;

forming a sacrificial gate structure over the fin structure;

etching a source/drain region of the fin structure, which is not covered by the sacrificial gate structure, thereby forming a source/drain space;

laterally etching the first semiconductor layers through the source/drain space; and forming a source/drain epitaxial layer in the source/drain space, wherein the forming the source/drain epitaxial layer comprises:

forming a first epitaxial layer;

forming a second epitaxial layer having a higher Ge content than the first epitaxial layer on the first epitaxial layer;

forming a third epitaxial layer having a higher Ge content than the second epitaxial layer on the second epitaxial layer;

forming a fourth epitaxial layer having a higher Ge content than the third epitaxial layer over the third epitaxial layer; and between forming the first epitaxial layer and forming the second epitaxial layer, performing an annealing operation in an ambient containing hydrogen at a higher temperature than temperatures for forming the first epitaxial layer and forming the second epitaxial layer, and the second, third and fourth epitaxial layers contain B.

18. The method of claim 17, wherein a B concentration of the second epitaxial layer increases as the second epitaxial layer is grown.

19. The method of claim 17, further comprising, before forming the first epitaxial layer, performing a chemical treatment using an HCl gas.

20. The method of claim 17, wherein a Ge content of the third epitaxial layer is constant.

* * * * *